(12) United States Patent
Hasegawa et al.

(10) Patent No.: US 12,230,618 B2
(45) Date of Patent: Feb. 18, 2025

(54) OPTICAL SENSOR, AND METHOD FOR MANUFACTURING OPTICAL SENSOR

(71) Applicant: ROHM CO., LTD., Kyoto (JP)

(72) Inventors: Yuya Hasegawa, Kyoto (JP); Takaaki Masaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 446 days.

(21) Appl. No.: 17/636,258

(22) PCT Filed: Jul. 21, 2020

(86) PCT No.: PCT/JP2020/028234
§ 371 (c)(1),
(2) Date: Feb. 17, 2022

(87) PCT Pub. No.: WO2021/039214
PCT Pub. Date: Mar. 4, 2021

(65) Prior Publication Data
US 2022/0302094 A1    Sep. 22, 2022

(30) Foreign Application Priority Data

Aug. 23, 2019   (JP) ................................. 2019-152616

(51) Int. Cl.
*H01L 25/16* (2023.01)
*H01L 31/0203* (2014.01)
(Continued)

(52) U.S. Cl.
CPC ........ *H01L 25/167* (2013.01); *H01L 31/0203* (2013.01); *H01L 31/02327* (2013.01);
(Continued)

(58) Field of Classification Search
None
See application file for complete search history.

(56) References Cited

U.S. PATENT DOCUMENTS

| 5,811,797 A | 9/1998 | Kobachi et al. |
| 6,060,337 A | 5/2000 | Kobachi et al. |

(Continued)

FOREIGN PATENT DOCUMENTS

| JP | H09148620 | 6/1997 |
| JP | 2002359394 | 12/2002 |

(Continued)

OTHER PUBLICATIONS

International Search Report and Written Opinion issued for International Patent Application No. PCT/JP2020/028234, Date of mailing: Sep. 24, 2020, 13 pages including English translation of Search Report.

(Continued)

*Primary Examiner* — Anthony Ho
(74) *Attorney, Agent, or Firm* — HSML P.C.

(57) ABSTRACT

An optical sensor includes a substrate including a substrate main surface intersecting a thickness-wise direction, a light emitting element disposed on the substrate main surface, a light receiving element disposed on the substrate main surface, a transparent first cover disposed on the substrate main surface to cover the light emitting element, and a transparent second cover disposed on the substrate main surface to cover the light receiving element. The first cover and the second cover are spaced apart by a gap.

17 Claims, 18 Drawing Sheets

(51) Int. Cl.
  *H01L 31/0232* (2014.01)
  *H01L 33/54* (2010.01)
  *H01L 33/58* (2010.01)
  *G01S 17/04* (2020.01)
  *H01L 23/00* (2006.01)

(52) U.S. Cl.
  CPC .............. *H01L 33/54* (2013.01); *H01L 33/58* (2013.01); *G01S 17/04* (2020.01); *H01L 24/48* (2013.01); *H01L 2224/48227* (2013.01); *H01L 2924/12041* (2013.01); *H01L 2924/12043* (2013.01); *H01L 2924/13056* (2013.01)

(56) References Cited

U.S. PATENT DOCUMENTS

| | | |
|---|---|---|
| 2002/0181898 A1 | 12/2002 | Nakano |
| 2012/0223231 A1 | 9/2012 | Nijaguna |
| 2015/0212208 A1 | 7/2015 | Hanada et al. |
| 2016/0377762 A1 | 12/2016 | Uedaira |
| 2019/0207051 A1 | 7/2019 | Utsumi |
| 2020/0303583 A1 | 9/2020 | Utsumi |

FOREIGN PATENT DOCUMENTS

| | | |
|---|---|---|
| JP | 2005116670 | 4/2005 |
| JP | 2006005141 | 1/2006 |
| JP | 2007013050 | 1/2007 |
| JP | 2008235599 | 10/2008 |
| JP | 2011119321 | 6/2011 |
| JP | 2013187357 | 9/2013 |
| JP | 2017011120 A | 1/2017 |
| WO | 2014054420 A1 | 4/2014 |
| WO | 2017203953 | 11/2017 |

OTHER PUBLICATIONS

International Preliminary Report on Patentability issued for International Patent Application No. PCT/JP2020/028234, Date of issuance: Feb. 17, 2022, 13 pages including English translation.

Notice of Reasons for Refusal issued for Japanese Patent Application No. 2021-542636, Dispatch Date: Jun. 4, 2024, 15 pages including English machine translation.

Notice of Reasons for Refusal issued for Japanese Patent Appliction No. 2021-542636, Dispatch date: Sep. 3, 2024, 12 pages including English machine translation.

53 (531~534), 63 (631~634)

OPTICAL SENSOR, AND METHOD FOR
MANUFACTURING OPTICAL SENSOR

TECHNICAL FIELD

The present disclosure relates to an optical sensor and a method for manufacturing an optical sensor.

BACKGROUND ART

Patent Literature 1 discloses a photoreflector that includes a substrate on which electrode patterns are formed, a light emitting diode disposed on the substrate, a photonic integrated circuit (IC) disposed on the substrate adjacent to the light emitting diode, an outer wall integrally surrounding the light emitting diode and the photonic IC, and an inner wall separating the light emitting diode and the photonic IC. The photoreflector is an example of an optical sensor. The optical sensor blocks diffusion light emitted from the light emitting diode with the light-blocking wall to reduce crosstalk.

CITATION LIST

Patent Literature

Patent Literature 1: Japanese Laid-Open Patent Publication No. 2007-13050

SUMMARY

Technical Problem

In an optical sensor such as that described above, there is still room for improvement from the aspect of reducing the size of the device. It is an objective of the present disclosure to provide an optical sensor and a method for manufacturing an optical sensor that allow for reduction in size while reducing crosstalk.

Solution to Problem

Means and operational advantages for solving the above-described problem will now be described.

To achieve the above objective, an optical sensor includes a substrate including a substrate main surface intersecting a thickness-wise direction, a light emitting element disposed on the substrate main surface, a light receiving element disposed on the substrate main surface, a transparent first cover disposed on the substrate main surface to cover the light emitting element, and a transparent second cover disposed on the substrate main surface to cover the light receiving element. The first cover and the second cover are spaced apart by a gap.

In the optical sensor, the gap is provided between the first cover covering the light emitting element and the second cover covering the light receiving element. Thus, as compared to when a gap is not provided between the first cover and the second cover, the optical sensor reduces light that is emitted from the light emitting element toward the light receiving element without being reflected by an object. In other words, the optical sensor reduces crosstalk. In addition, the optical sensor does not need to include a light-blocking wall between the first cover and the second cover, thereby facilitating reduction in the size of the device.

Advantageous Effects

The optical sensor described above allows for reduction in size while reducing crosstalk.

DESCRIPTION OF EMBODIMENTS

Embodiments of an optical sensor will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

First Embodiment

A first embodiment of an optical sensor 10 will now be described. The optical sensor 10 is used to detect an object that is present near the optical sensor 10, more specifically, that is separated from the optical sensor 10 by approximately 6 mm. In an example, the optical sensor 10 is used for a wearable device such as an earphone. In this case, an object that is subject to detection is, for example, a human body or an inner wall of the case accommodating the wearable device.

Figure 1:
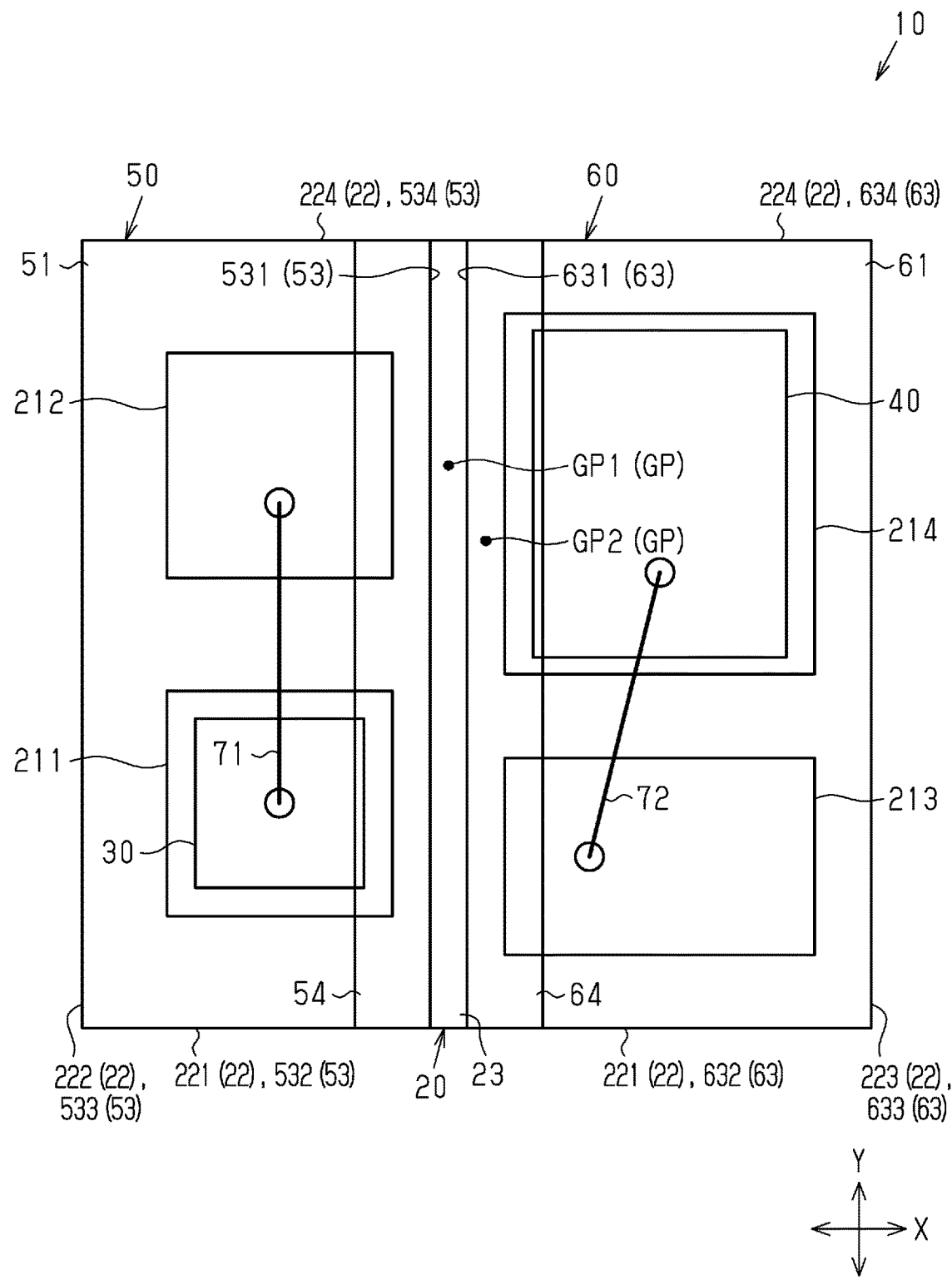
FIG. 1 is a plan view showing a first embodiment of an optical sensor.
Figure 2:
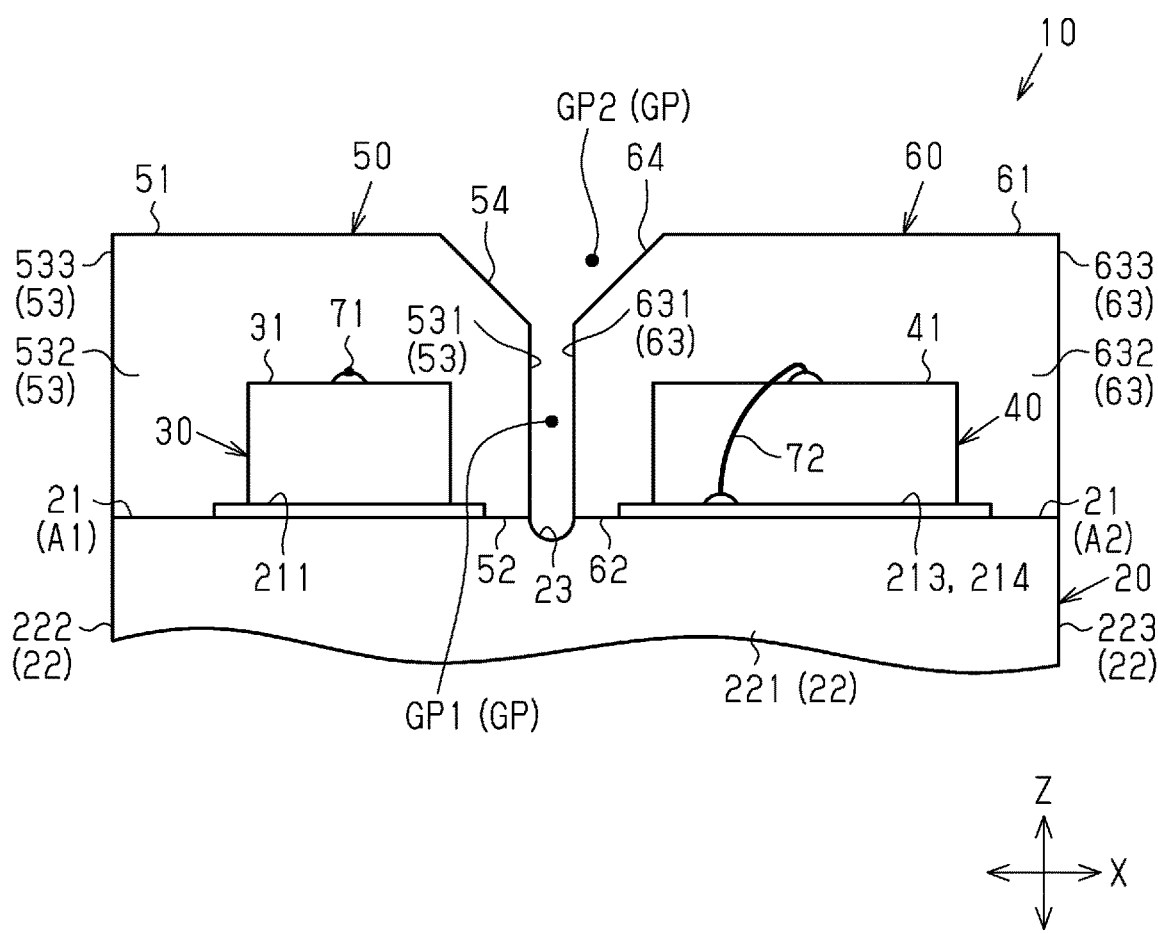
FIG. 2 is a side view showing the optical sensor of the first embodiment.

As shown in FIGS. 1 and 2, the optical sensor 10 includes a substrate 20, a light emitting element 30, a light receiving element 40, a first cover 50, a second cover 60, and bonding wires 71 and 72. In the drawings starting from FIG. 1, the first cover 50 and the second cover 60 are shown as being transparent.

The optical sensor 10 has the form of a rectangular plate. In the description hereafter, directions are defined in conformance with the shape of the optical sensor 10. More specifically, the thickness-wise direction of the optical sensor 10 is referred to as "the thickness-wise direction Z." A direction orthogonal to the thickness-wise direction Z is referred to as "the first direction X." A direction orthogonal to the thickness-wise direction Z and the first direction X is referred to as "the second direction Y."

The dimension of the optical sensor 10 in the thickness-wise direction Z is, preferably, greater than or equal to 0.3 mm and less than or equal to 0.55 mm, and is 0.55 mm in the first embodiment. The dimension of the optical sensor 10 in the first direction X and the second direction Y is, preferably, greater than or equal to 0.5 mm and less than or equal to 1.0 mm, and is 1.0 mm in the first embodiment. That is, the optical sensor 10 is square in plan view in the thickness-wise direction Z.

As shown in FIGS. 1 and 2, the substrate 20 has the form of a rectangular plate. The material of the substrate 20 may be, for example, a ceramic such as alumina or aluminum nitride, silicon, or a glass epoxy.

The substrate 20 includes a substrate main surface 21 intersecting the thickness-wise direction Z and substrate side surfaces 22 extending from outer edges of the substrate main surface 21 in the thickness-wise direction Z. The substrate side surfaces 22 are formed of four surfaces and include a first substrate side surface 221, a second substrate side surface 222, a third substrate side surface 223, and a fourth substrate side surface 224. As shown in FIG. 1, the first substrate side surface 221 and the fourth substrate side surface 224 extend in the first direction X, and the second substrate side surface 222 and the third substrate side surface 223 extend in the second direction Y The second substrate side surface 222 and the third substrate side surface 223 join the first substrate side surface 221 and the fourth substrate side surface 224.

A groove 23 is recessed from the substrate main surface 21 and extends in the second direction Y. The groove 23 linearly extends from one end to the other end of the substrate main surface 21 in the second direction Y to separate the substrate main surface 21 into a first region A1 and a second region A2. That is, the longitudinal direction of the groove 23 conforms to the second direction Y, and the width-wise direction of the groove 23 conforms to the first direction X. The formation position of the groove 23 in the first direction X is slightly displaced from the center of the substrate main surface 21 in the first direction X. More specifically, the groove 23 is formed in a position closer to the second substrate side surface 222 than to the third substrate side surface 223 in the first direction X. The cross-sectional shape of the groove 23 that is orthogonal to the second direction Y may be a semicircle or a rectangle.

In plan view in the thickness-wise direction Z, the first region A1 is rectangular and has a short-side direction conforming to the first direction X and a long-side direction conforming to the second direction Y. In the same manner, the second region A2 is rectangular and has a short-side direction conforming to the first direction X and a long-side direction conforming to the second direction Y. The first region A1 is less than the second region A2 in the first direction X dimension. The first region A1 is equal to the second region A2 in dimension in the second direction Y. Thus, in plan view in the thickness-wise direction Z, the area of the first region A1 is smaller than the area of the second region A2.

A first pad 211, a second pad 212, a third pad 213, and a fourth pad 214 are formed of a conductor and formed on the substrate main surface 21. The first pad 211, the second pad 212, the third pad 213, and the fourth pad 214 have the form of a rectangular plate. In plan view in the thickness-wise direction Z, the first pad 211 is substantially equal in size to the second pad 212 and is smaller than the other pads 213 and 214. In plan view in the thickness-wise direction Z, the fourth pad 214 is larger than the other pads 211 to 213. The first pad 211 and the second pad 212 are disposed in the first region A1. The third pad 213 and the fourth pad 214 are disposed in the second region A2. That is, in the substrate main surface 21, the first pad 211 and the second pad 212 are disposed at one side of the groove 23, and the third pad 213 and the fourth pad 214 are located at the other side of the groove 23.

As shown in FIG. 1, the first pad 211 is disposed closer to the first substrate side surface 221 than to the fourth substrate side surface 224. The second pad 212 is disposed closer to the fourth substrate side surface 224 than to the first substrate side surface 221. The third pad 213 is disposed closer to the first substrate side surface 221 than to the fourth substrate side surface 224. The fourth pad 214 is disposed closer to the fourth substrate side surface 224 than to the first substrate side surface 221.

The first pad 211 and the third pad 213 are disposed so as to at least partially overlap in the first direction X. The second pad 212 and the fourth pad 214 are disposed so as to overlap at least partially in the first direction X. The first pad 211 and the second pad 212 are disposed so as to entirely overlap in the second direction Y. The third pad 213 and the fourth pad 214 are disposed so as to entirely overlap in the second direction Y. That is, the first pad 211 and the second pad 212 align in the second direction Y. The third pad 213 and the fourth pad 214 align in the second direction Y.

The first pad 211 and the fourth pad 214 are disposed so as not to overlap in either the first direction X or the second direction Y. In the same manner, the second pad 212 and the third pad 213 are disposed so as not to overlap in either the first direction X or the second direction Y. Thus, in plan view in the thickness-wise direction Z, the first pad 211 and the fourth pad 214 are disposed on one of the diagonals of the substrate main surface 21 and separated from each other. The second pad 212 and the third pad 213 are disposed on the other diagonal of the substrate main surface 21 and separated from each other.

Although not shown in the drawings, the substrate 20 includes a substrate back surface that is opposite the substrate main surface 21. The substrate back surface is provided with four back surface electrodes that are electrically connected to the first pad 211, the second pad 212, the third pad 213, and the fourth pad 214.

As shown in FIGS. 1 and 2, the light emitting element 30 is substantially rectangular-box-shaped. The light emitting element 30 is square in plan view in the thickness-wise direction Z. That is, the dimensions of the light emitting element 30 in the first direction X and the second direction Y are equal.

The light emitting element 30 is disposed in the first region A1 of the substrate main surface 21. More specifically, the light emitting element 30 is mounted on the first pad 211 of the substrate main surface 21. Thus, the light emitting element 30 is disposed closer to the first substrate side surface 221 than to the fourth substrate side surface 224 in the second direction Y. The light emitting element 30 is electrically connected to the second pad 212 by the bonding wire 71.

The light emitting element 30 is, for example, a light emitting diode (LED). The light emitting element 30 emits light in a direction substantially perpendicular to the substrate main surface 21. At this time, the light emitted from the light emitting element 30 may have a certain divergence angle. The wavelength of light emitted from the light emitting element 30 is in a range of, for example, 650 nm to 1300 nm. The light emitting element 30 includes an upper surface 31 used as a light emitting surface that emits light.

As shown in FIGS. 1 and 2, the light receiving element 40 is substantially rectangular-box-shaped. The light receiving element 40 is rectangular in plan view in the thickness-wise direction Z. In the same manner as the second region A2, the light receiving element 40 is rectangular and has a short-side direction conforming to the first direction X and a long-side direction conforming to the second direction Y. The light receiving element 40 is greater than the light emitting element 30 in the first direction X dimension and the second direction Y dimension and is equal to the light emitting element 30 in the thickness-wise direction Z dimension.

The light receiving element 40 is disposed in the second region A2 of the substrate main surface 21 so as to be adjacent to the light emitting element 30. More specifically, the light receiving element 40 is mounted on the fourth pad 214 of the substrate main surface 21. Thus, the light receiving element 40 is disposed closer to the fourth substrate side surface 224 than to the first substrate side surface 221 in the second direction Y. The light receiving element 40 is electrically connected to the third pad 213 by the bonding wire 72.

The light receiving element 40 is configured to detect reflection light of the light emitted from the light emitting element 30 toward a detection subject. The light receiving element 40 outputs an analog signal according to the amount of received light. The light receiving element 40 is, for example, a photodiode, a phototransistor, or a photonic IC. The light receiving element 40 includes an upper surface 41 used as a light receiving surface that receives light.

In the first embodiment, in the thickness-wise direction Z, the upper surface 31 of the light emitting element 30 substantially coincides with the upper surface 41 of the light receiving element 40. That is, in the thickness-wise direction Z, the length from the substrate main surface 21 to the upper surface 31 of the light emitting element 30 is substantially equal to the length from the substrate main surface 21 to the upper surface 41 of the light receiving element 40.

As shown in FIGS. 1 and 2, the first cover 50 is disposed on the substrate main surface 21 to cover the light emitting element 30. In the first embodiment, the first cover 50 seals the first pad 211, the second pad 212, the light emitting element 30, and the bonding wire 71. The first cover 50 is provided to protect the components of the optical sensor 10. The first cover 50 is, for example, formed from a resin material that is transparent to a wavelength of light emitted from the light emitting element 30. Such a resin material includes an epoxy resin, a silicone resin, a silicone-modified epoxy resin, a polyamide resin, an acrylic resin, or a urea resin.

The first cover 50 is rectangular-box-shaped and is substantially equal in size to the first region A1 of the substrate main surface 21 in plan view in the thickness-wise direction Z. The first cover 50 includes a first upper surface 51, a first back surface 52, a first side surfaces 53, and a first inclined surface 54.

The first upper surface 51 is opposite the first back surface 52 and is rectangular. The first upper surface 51 is opposed to the upper surface 31 of the light emitting element 30 in the thickness-wise direction Z. The first back surface 52 faces the substrate main surface 21 and is rectangular. The first back surface 52 includes portions that are recessed in conformance with the outer shape of the first pad 211, the second pad 212, and the light emitting element 30. The first back surface 52 includes non-recessed portions that are in contact with the first region A1 of the substrate main surface 21.

The first side surfaces 53 intersect the first upper surface 51, the first back surface 52, and the first inclined surface 54 and join the first upper surface 51 and the first inclined surface 54 to the first back surface 52 in the thickness-wise direction Z. In the first embodiment, the first side surfaces 53 are formed of four rectangular surfaces. The first side surfaces 53 include a first inner side surface 531 that faces the second cover 60 and first outer side surfaces 532, 533, and 534 that do not face the second cover 60.

The first inner side surface 531 is formed of one surface. The first outer side surfaces 532, 533, and 534 are formed of three surfaces. The first inner side surface 531 and the first outer side surface 533 intersect the first direction X. The first outer side surface 532 and the first outer side surface 534 intersect the second direction Y. The first inner side surface 531 is flush with the wall surface of the groove 23 in the substrate 20. The first outer side surface 532 is flush with the first substrate side surface 221. The first outer side surface 533 is flush with the second substrate side surface 222. The first outer side surface 534 is flush with the fourth substrate side surface 224.

The first inclined surface 54 is formed on a corner of the first cover 50 at which the first upper surface 51 and the first inner side surface 531 are joined. The first inclined surface 54 intersects the first upper surface 51 and the first inner side surface 531. The first inclined surface 54 is rectangular and has a long-side direction conforming to the second direction Y and a short-side direction conforming to a direction that intersects the first upper surface 51 and the first inner side surface 531. The formation angle of the first inclined surface 54 and the size of the first inclined surface 54 may be appropriately selected. In the first embodiment, the angle between the first inclined surface 54 and the first upper surface 51 is equal to the angle between the first inclined surface 54 and the first inner side surface 531.

Figure 3:
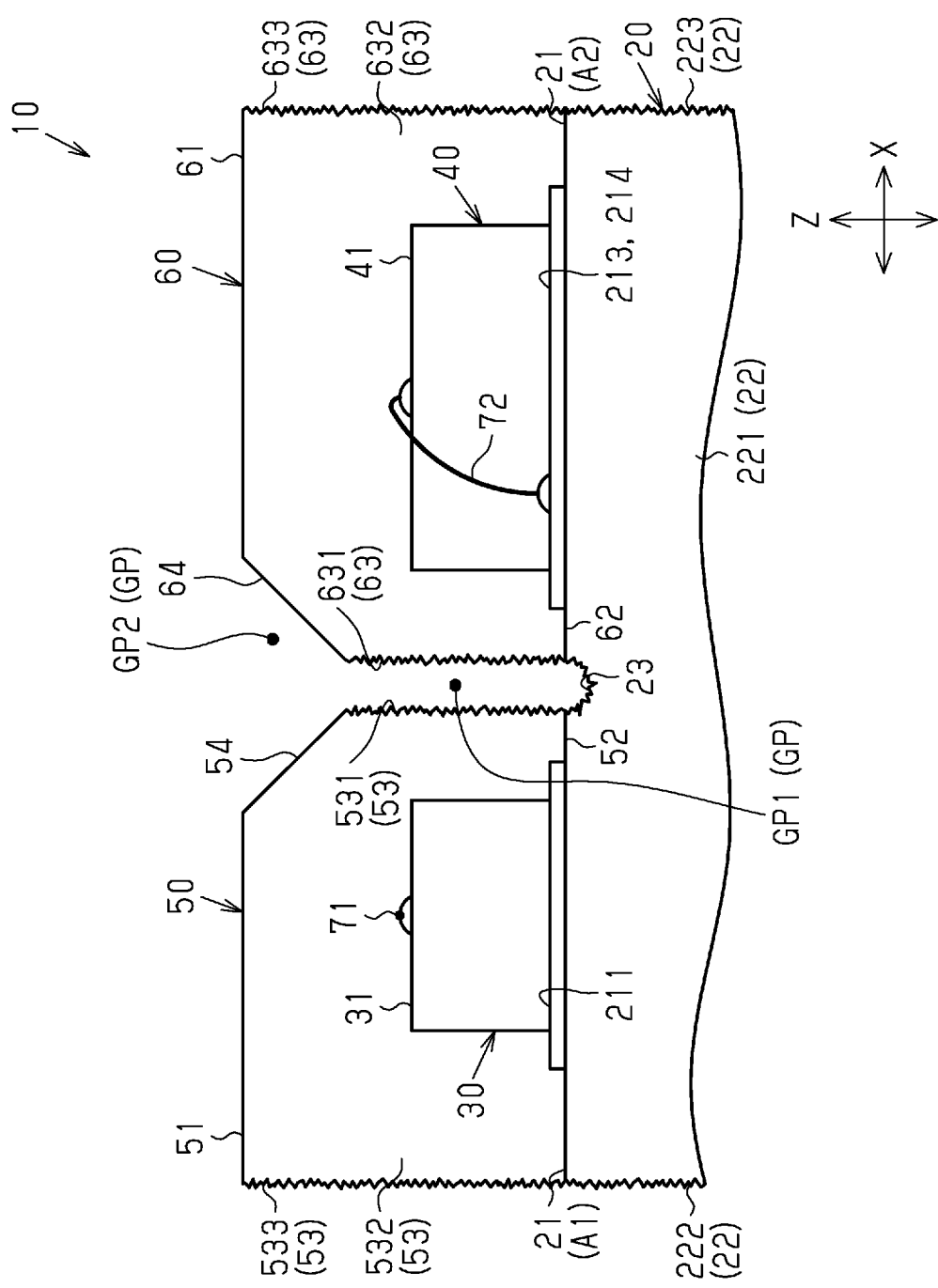
FIG. 3 is a side view showing the optical sensor of the first embodiment.

As shown in FIG. 3, the first side surfaces 53 have a greater roughness than the first upper surface 51. More specifically, the first inner side surface 531 has a greater roughness than the first upper surface 51. The first outer side surfaces 532, 533, and 534 have a greater roughness than the first upper surface 51. The surface roughness of the first inclined surface 54 is similar to that of the first upper surface 51. FIG. 3 is an enlarged diagram of FIG. 2 and shows the irregularities of the first inner side surface 531 and other surfaces in a manner exaggerated from the actual surfaces. FIG. 3 does not show the irregularities of, for example, the first outer side surface 532.

As shown in FIGS. 1 and 2, the second cover 60 is disposed on the substrate main surface 21 to cover the light receiving element 40. In the first embodiment, the second cover 60 seals the third pad 213, the fourth pad 214, the light receiving element 40, and the bonding wire 72. The second cover 60 is provided to protect the components described above. In the same manner as the first cover 50, the second cover 60 is formed from a resin material that is transparent to a wavelength of light emitted from the light emitting element 30.

The second cover 60 is substantially rectangular-box-shaped and is greater in size than the first cover 50. More specifically, the second cover 60 is greater than the first cover 50 in the first direction X dimension and is equal to the first cover 50 in the second direction Y dimension and the thickness-wise direction Z dimension. The second cover 60 is substantially equal in size to the second region A2 of the substrate main surface 21 in plan view in the thickness-wise direction Z. The second cover 60 includes a second upper surface 61, a second back surface 62, second side surfaces 63, and a second inclined surface 64.

The second upper surface 61 is rectangular and is opposite the second back surface 62 in the thickness-wise direction Z. The second upper surface 61 is opposed to the upper surface 41 of the light receiving element 40 in the thickness-wise direction Z. The second back surface 62 faces the substrate main surface 21 and is rectangular. The second back surface 62 includes portions that are recessed in conformance with the outer shape of the third pad 213, the fourth pad 214, the light emitting element 30. The second back surface 62 includes non-recessed portions that are in contact with the second region A2 of the substrate main surface 21.

The second side surfaces 63 intersect the second upper surface 61, the second back surface 62, and the second inclined surface 64 and join the second upper surface 61 and the second inclined surface 64 to the second back surface 62 in the thickness-wise direction Z. In the first embodiment, the second side surfaces 63 are formed of four rectangular surfaces. The second side surfaces 63 include a second inner side surface 631 that faces the first cover 50 and second outer side surfaces 632, 633, and 634 that do not face the first cover 50.

The second inner side surface 631 is formed of one surface. The second outer side surfaces 632, 633, and 634 are formed of three surfaces. The second inner side surface 631 and the second outer side surface 633 intersect the first direction X. The second outer side surface 632 and the second outer side surface 634 intersect the second direction Y. The second inner side surface 631 is flush with the wall surface of the groove 23 in the substrate 20. The second outer side surface 632 is flush with the first substrate side surface 221. The second outer side surface 633 is flush with the third substrate side surface 223. The second outer side surface 634 is flush with the fourth substrate side surface 224.

The second inclined surface 64 is formed on a corner of the second cover 60 at which the second upper surface 61 and the second inner side surface 631 are joined. The second inclined surface 64 intersects the second upper surface 61 and the second inner side surface 631. The second inclined surface 64 is rectangular and has a long-side direction conforming to the second direction Y and a short-side direction conforming to a direction that intersects the second upper surface 61 and the second inner side surface 631. The formation angle of the second inclined surface 64 and the size of the second inclined surface 64 may be appropriately selected. In the first embodiment, the angle between the second inclined surface 64 and the second upper surface 61 is equal to the angle between the second inclined surface 64 and the second inner side surface 631.

As shown in FIG. 3, the second side surfaces 63 have a greater roughness than the second upper surface 61. More specifically, the second inner side surface 631 has a greater roughness than the second upper surface 61. The second outer side surfaces 632, 633, and 634 have a greater roughness than the second upper surface 61. The surface roughness of the second inclined surface 64 is similar to that of the second upper surface 61. In the same manner as the first inner side surface 531, FIG. 3 shows the irregularities of the second inner side surface 631 and other surfaces in a manner exaggerated from the actual surfaces. FIG. 3 does not show the irregularities of, for example, the second outer side surface 632 in the same manner as the first outer side surface 532.

As shown in FIGS. 1 and 2, the first cover 50 is disposed in the first region A1 of the substrate main surface 21 and the second cover 60 is disposed in the second region A2 of the substrate main surface 21. Thus, the first cover 50 and the second cover 60 are considered to align in the first direction X.

In addition, the first cover 50 and the second cover 60 are spaced apart from each other by a gap GP. More specifically, the gap GP is located between the first cover 50 and the second cover 60 in the first direction X and extends in the second direction Y along the first inner side surface 531 and the first inclined surface 54 and the second inner side surface 631 and the second inclined surface 64. The first cover 50 and the second cover 60 oppose each other in the first direction X at opposite sides of the gap GP. In the first embodiment, the opposing direction of the first cover 50 and the second cover 60 conforms to the first direction X. Thus, the first direction X may be referred to as the opposing direction of the first cover 50 and the second cover 60 or the alignment direction of the first cover 50 and the second cover 60.

The first inner side surface 531, the second inner side surface 631, the first inclined surface 54, and the second inclined surface 64 face the gap GP. The first outer side surfaces 532, 533, and 534 and the second outer side surfaces 632, 633, and 634 do not face the gap GP. In other words, the first inner side surface 531, the second inner side surface 631, the first inclined surface 54, and the second inclined surface 64 define the gap GP. The first outer side surfaces 532, 533, and 534 and the second outer side surfaces 632, 633, and 634 do not define the gap GP. In addition, the first inner side surface 531 and the second inner side surface 631 are opposed in the first direction X at opposite sides of the gap GP. The first inclined surface 54 and the second inclined surface 64 are opposed in the first direction X at opposite sides of the gap GP.

As shown in FIG. 2, the first inclined surface 54 and the second inclined surface 64 extend in different directions. In the first embodiment, the first inclined surface 54 and the second inclined surface 64 extend in directions orthogonal to each other. The inclination of the first inclined surface 54 with respect to the thickness-wise direction Z is equal to the inclination of the second inclined surface 64 with respect to the thickness-wise direction Z. Therefore, as shown in FIG. 2, the first inclined surface 54 and the second inclined surface 64 are symmetrical about a line segment extending through the center of the gap GP. The first inclined surface 54 and the second inclined surface 64 do not necessarily have to have the same formation angle and the same size.

The gap GP is open upward in the thickness-wise direction Z and open in the second direction Y. In the first embodiment, the gap GP is filled with gases in the environment in which the optical sensor 10 is installed and is, for example, air. The gap GP includes a first part GP1 having a constant width in the first direction X and a second part GP2 having a width in the first direction X that gradually increases as the second part GP2 extends away from the substrate main surface 21.

The first part GP1 extends between the first inner side surface 531 of the first cover 50 and the second inner side surface 631 of the second cover 60. The second part GP2 extends between the first inclined surface 54 of the first cover 50 and the second inclined surface 64 of the second cover 60. The first part GP1 is located closer to the substrate 20 than the second part GP2. The first part GP1 is connected to the second part GP2 in the thickness-wise direction Z.

In the first embodiment, in plan view, in the thickness-wise direction Z, the longitudinal direction of the gap GP conforms to the second direction Y. As shown in FIG. 2, the gap GP is connected to the groove 23 in the thickness-wise direction Z. In other words, the groove 23 is formed in a portion of the substrate main surface 21 that faces the gap GP. Preferably, the width of the gap GP in the first direction X is, for example, greater than or equal to 0.03 mm and less than 0.1 mm.

In comparison of the first cover 50 with the second cover 60, the first inner side surface 531 and the second inner side surface 631 have substantially the same surface roughness, and the first outer side surfaces 532, 533, and 534 and the second outer side surfaces 632, 633, and 634 have substantially the same surface roughness. Also, the first upper surface 51 and the second upper surface 61 have substantially the same surface roughness, and the first inclined surface 54 and the second inclined surface 64 have substantially the same surface roughness.

A method for manufacturing the optical sensor 10 will now be briefly described. The manufacturing method of the first embodiment is a method for simultaneously manufacturing a number of optical sensors 10.

Figure 4:
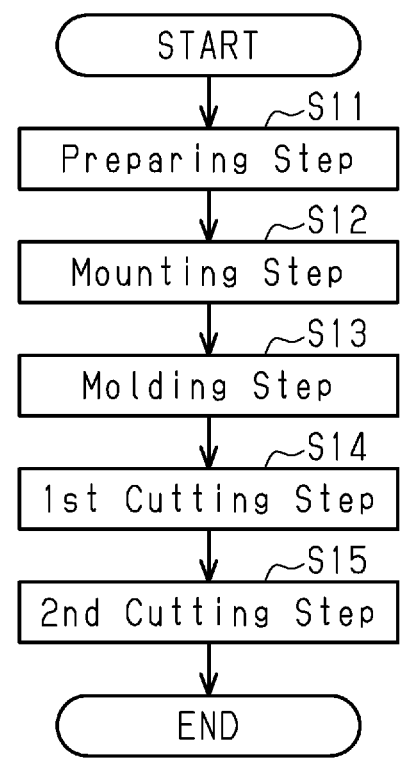
FIG. 4 is a chart showing the steps of manufacturing the optical sensor of the first embodiment.

As shown in FIG. 4, the method for manufacturing the optical sensors 10 includes a preparing step S11, a mounting step S12, a molding step S13, a first cutting step S14 as "the cutting step," and a second cutting step S15.

The preparing step S11 is a step of preparing a large substrate 110 that is formed of the same material as the substrate 20 and is greater in size than the substrate 20. The mounting step S12 is a step subsequent to the preparing step S11 and is a step of forming pads 211 to 214 and back surface electrodes on the large substrate 110 and mounting light emitting elements 30 and light receiving elements 40 on the large substrate 110.

Figure 5:
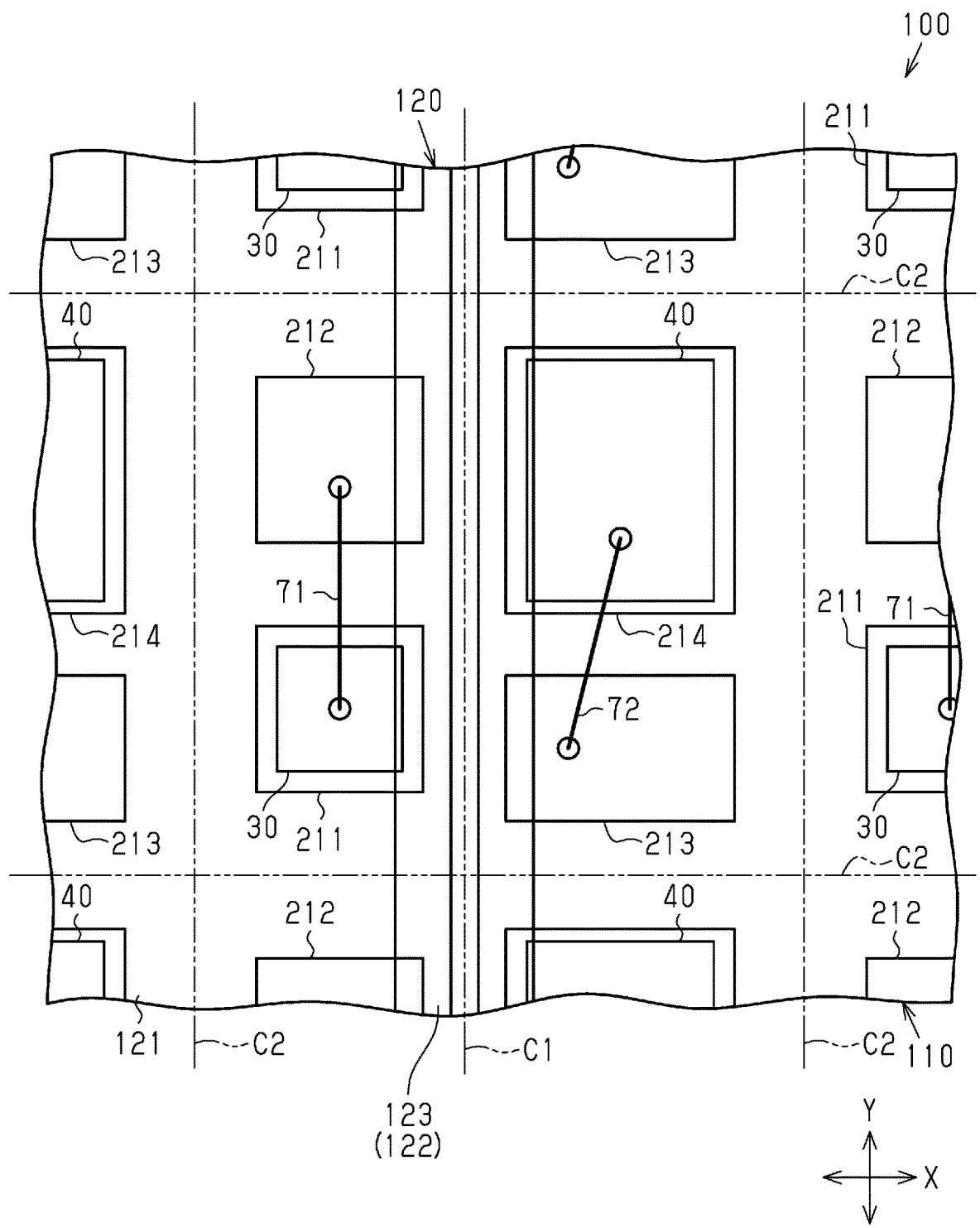
FIG. 5 is a plan view of an intermediate body used when manufacturing the optical sensor of the first embodiment.
Figure 6:
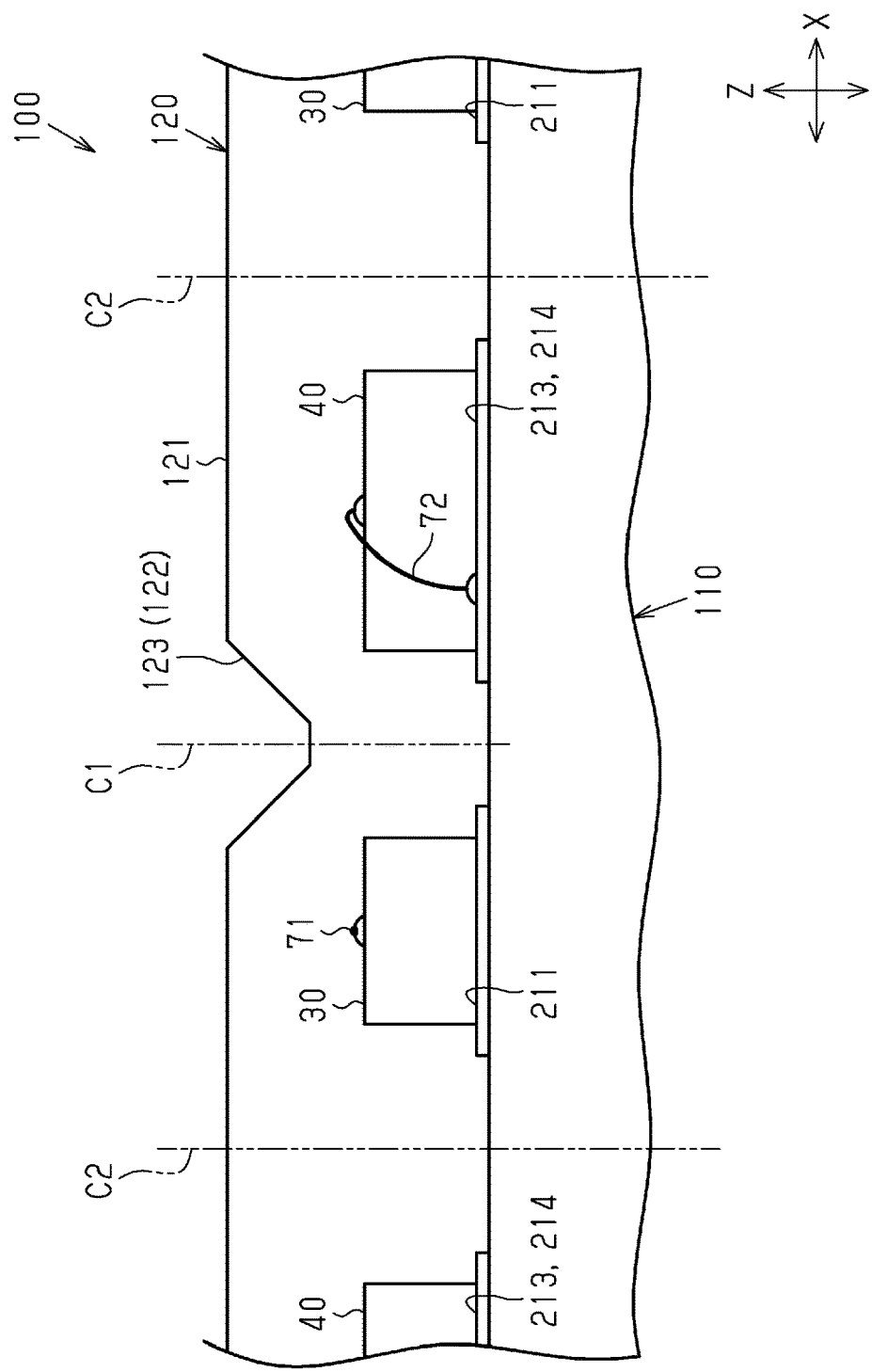
FIG. 6 is a side view of the intermediate body used when manufacturing the optical sensor of the first embodiment.

The molding step S13 is a step subsequent to the mounting step S12 and is a step of forming a resin layer 120 on the large substrate 110 through resin molding using molds. When the molding step S13 is performed, the resin layer 120 covers the pads 211 to 214, the light emitting elements 30, the light receiving elements 40, and the upper surface of the large substrate 110. As a result, as shown in FIGS. 5 and 6, an intermediate body 100 is formed. In the intermediate body 100, recesses 122 are formed in a front surface 121 of the resin layer 120 and extend in a direction orthogonal to the thickness-wise direction Z of the large substrate 110. The cross-sectional shape of a recess 122 in a direction orthogonal to the longitudinal direction is an isosceles trapezoid. In the intermediate body 100, the front surface 121 of the resin layer 120 and inclined surfaces 123 of the recess 122 are molded surfaces formed by the molds. FIGS. 5 and 6 show only one of the recesses 122 in accordance with the illustrated part of the intermediate body 100.

The first cutting step S14 is a step subsequent to the molding step S13 and is a step of performing cutting to form a portion corresponding to the gap GP in the optical sensor 10. The first cutting step S14 is performed by rotating and moving a dicing blade along a straight line C1 shown in FIGS. 5 and 6. In this step, portions of the resin layer 120 that will later become the first cover 50 and the second cover 60 are separated in the first direction X. That is, the portion of the resin layer 120 located between the portion covering the light emitting element 30 and the portion covering the light receiving element 40 is cut. The first cutting step S14 is performed when the lowermost part of the dicing blade is located below the upper surface of the large substrate 110 in the thickness-wise direction Z. Thus, when the gap GP is formed in the resin layer 120, the groove 23 is formed in the substrate 20 of the optical sensor 10.

In the first embodiment, the dicing blade is used to form the gap GP. Therefore, for example, the productivity is increased as compared to when etching is used to form the gap GP. Also, the molds are less complex as compared to when molds are used to form the gap GP.

Finally, the second cutting step S15 is a step of performing dicing along a straight line C2 shown in FIGS. 5 and 6 to taking out the optical sensors 10 from the intermediate body 100. In this step, the large substrate 110 and the resin layer 120 are simultaneously cut. The dicing blade for cutting out the optical sensors 10 from the intermediate body 100 and the dicing blade for forming the gap GP in the resin layer 120 may be the same type or different types.

The front surface 121 of the resin layer 120 will later become the first upper surface 51 of the first cover 50 and the second upper surface 61 of the second cover 60. The inclined surfaces 123 of the recesses 122 will later become the first inclined surface 54 of the first cover 50 and the second inclined surface 64 of the second cover 60. Thus, in the first embodiment, the first upper surface 51, the second upper surface 61, the first inclined surface 54, and the second inclined surface 64 have substantially the same surface roughness. Also, in this regard, the first upper surface 51 is coplanar with the second upper surface 61.

Figure 7:
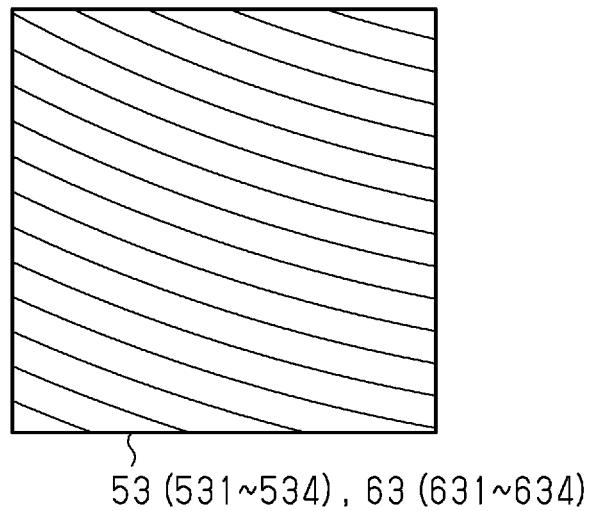
FIG. 7 is a schematic partial diagram showing a diced surface of the optical sensor of the first embodiment.

The groove 23 of the substrate 20, the first inner side surface 531 of the first cover 50, and the second inner side surface 631 of the second cover 60 are formed by dicing the intermediate body 100 along the straight line C1 shown in FIG. 6. Thus, as shown in FIG. 7, cutting marks are left in the first inner side surface 531 and the second inner side surface 631. As a result, as shown in FIG. 3, the first inner side surface 531 and the second inner side surface 631 have substantially the same surface roughness and have a greater roughness than the first upper surface 51 and the second upper surface 61. The shape of a cross section of the groove 23 that is orthogonal to the longitudinal direction conforms to the shape of the edge of the dicing blade. The wall surface of the groove 23 has a rough surface.

The substrate side surfaces 22, the first outer side surfaces 532, 533, and 534, and the second outer side surfaces 632, 633, and 634 are formed by dicing the intermediate body 100 along the straight lines C2 shown in FIG. 6. Thus, as shown in FIG. 7, cutting marks are also left in the first outer side surfaces 532, 533, and 534 and the second outer side surfaces 632, 633, and 634. As a result, as shown in FIG. 3, the first outer side surfaces 532, 533, and 534 and the second outer side surfaces 632, 633, and 634 have substantially the same surface roughness and have a greater roughness than the first upper surface 51 and the second upper surface 61.

The cutting marks shown in FIG. 7 are an example and may vary depending on, for example, the diameter of a dicing blade, a moving direction of the dicing blade, the rotation speed of the dicing blade, a moving speed of the dicing blade in the dicing direction, the material of the dicing blade, and the material of the resin layer 120.

The operation and advantages of the first embodiment will now be described.

Figure 8:
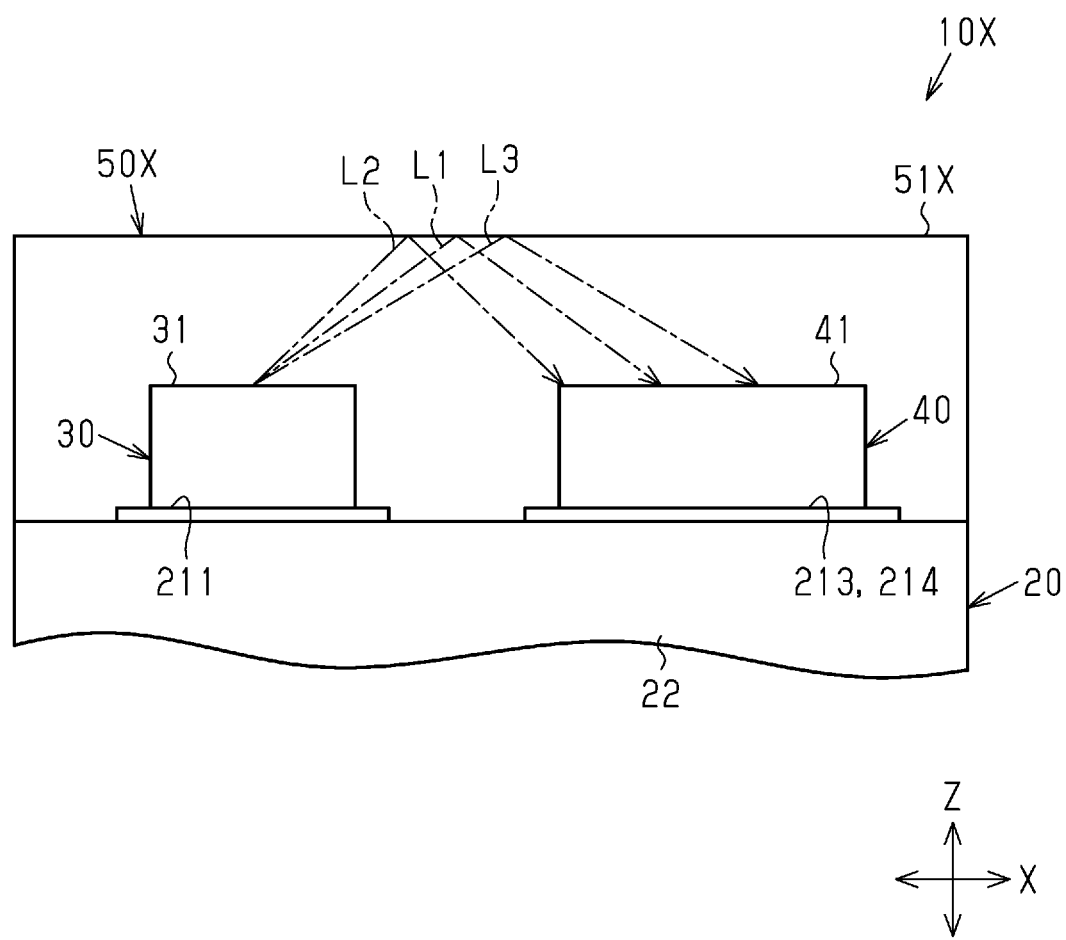
FIG. 8 is a side view showing a comparative example of an optical sensor illustrating its operation.
Figure 9:
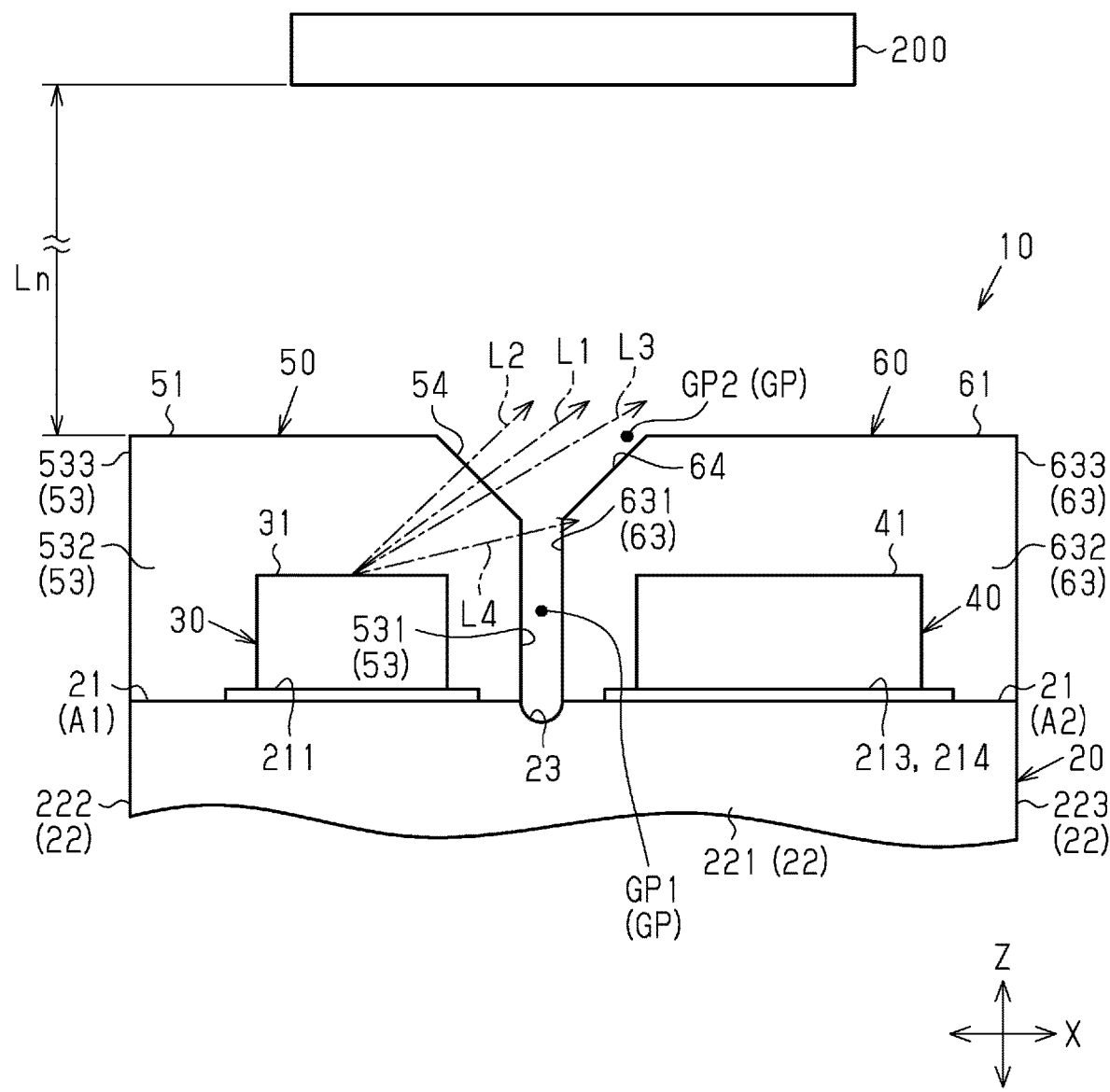
FIG. 9 is a side view of the optical sensor of the first embodiment illustrating its operation.

More specifically, with reference to FIGS. 8 and 9, the optical sensor 10 of the first embodiment will be described as compared with a comparative example of an optical sensor 10X. FIGS. 8 and 9 do not show some of the components of the optical sensors 10 and 10X to facilitate understanding of the illustration.

(1) FIG. 8 shows the comparative example of the optical sensor 10X that includes a cover 50X integrally covering the light emitting element 30 and the light receiving element 40. When diffusion light L1 is emitted from the light emitting element 30, the diffusion light L1 is partially reflected by an upper surface 51X of the cover 50X toward the light receiving element 40. In comparison, as shown in FIG. 9, the optical sensor 10 of the first embodiment is provided with the gap GP between the first cover 50, which covers the light emitting element 30, and the second cover 60, which covers the light receiving element 40. When diffusion light L1 is emitted from the light emitting element 30, the diffusion light L1 is transmitted through the gap GP and is not reflected by the first upper surface 51 of the first cover 50 and the second upper surface 61 of the second cover 60.

In addition, as shown in FIG. 9, when there is diffusion light L4 transmitting from the first cover 50 to the second cover 60 through the gap GP, the diffusion light L4 is partially reflected by the first inner side surface 531 or the second inner side surface 631. The intensity of such diffusion light is likely to be decreased when reaching the inside of the second cover 60.

Thus, in the optical sensor 10, light emitted from the light emitting element 30 toward the light receiving element 40 without being reflected by an object is reduced as compared to the optical sensor 10X of the comparative example. In other words, the optical sensor 10 reduces crosstalk.

In addition, the optical sensor 10 does not include a light-blocking wall between the first cover 50 and the second cover 60, thereby facilitating reduction in the size of the device. In this regard, the optical sensor 10 also simplifies the structure of the sensor, thereby obviating complication of the manufacturing steps of the optical sensor 10.

(2) As shown in FIG. 8, in the comparative example in which the cover 50X does not include the first inclined surface 54, when diffusion light L2 is emitted from the light emitting element 30 and reflected by the first upper surface 51, the diffusion light L2 may be partially directed toward the light receiving element 40.

In this regard, as shown in FIG. 9, in the optical sensor 10 of the first embodiment, the first cover 50 includes the first inclined surface 54. Hence, as shown in FIG. 9, the diffusion light L2 easily transmits through the first inclined surface 54 and is less likely to be reflected by the first upper surface 51. As a result, the optical sensor 10 reduces crosstalk caused by reflection of the diffusion light L2 on the first upper surface 51.

(3) As shown in FIG. 8, in the comparative example in which the cover 50X does not include the second inclined surface 64, when diffusion light L3 is emitted from the light emitting element 30, the diffusion light L3 may be reflected by the upper surface 51X of the cover 50X and directed toward the light receiving element 40. In this regard, as shown in FIG. 9, in the optical sensor 10 of the first embodiment, the second cover 60 includes the second inclined surface 64. Hence, as shown in FIG. 9, the diffusion light L3 is less likely to enter the second cover 60 and is less likely to be directed toward the light receiving element 40. As a result, the optical sensor 10 reduces crosstalk caused by reflection of the diffusion light L3 on the second upper surface 61.

(4) As shown in FIG. 9, in the optical sensor 10, the first outer side surfaces 532, 533, and 534 of the first cover 50 are flush with the substrate side surfaces 22 (221, 222, 224). The second outer side surfaces 632, 633, and 634 of the second cover 60 are flush with the substrate side surfaces 22 (221, 223, 224). That is, the optical sensor 10 does not include a peripheral wall that surrounds the first cover 50 and the second cover 60. Thus, the optical sensor 10 further facilitates reduction in the size of the device.

(5) In the optical sensor 10, the first inner side surface 531 and the second inner side surface 631 have a greater roughness than the first upper surface 51 and the second upper surface 61. Thus, as shown in FIG. 9, when the diffusion light L4 is emitted from the light emitting element 30, the diffusion light L4 is reflected, dispersed, or refracted as the diffusion light L4 enters the gap GP from the first cover 50 and enters the second cover 60 from the gap GP. Thus, the optical sensor 10 attenuates the diffusion light L4 using the first inner side surface 531 and the second inner side surface 631 having a rough surface.

(6) In the optical sensor 10, the first outer side surfaces 532, 533, and 534 have a greater roughness than the first upper surface 51 and the second upper surface 61. Thus, the optical sensor 10 limits leakage of diffusion light emitted from the light emitting element 30 to the outside of the optical sensor 10 through the first outer side surfaces 532, 533, and 534.

(7) In the optical sensor 10, the second outer side surfaces 632, 633, and 634 have a greater roughness than the first upper surface 51 and the second upper surface 61. Thus, the optical sensor 10 hinders external light that is incident on the second cover 60 in the first direction X and the second direction Y from reaching the light receiving element 40.

(8) As shown in FIG. 1, in plan view in the thickness-wise direction Z, the light emitting element 30 and the light receiving element 40 are disposed at different positions in the second direction Y, that is, the direction in which the gap GP extends. More specifically, in plan view in the thickness-wise direction Z, the light emitting element 30 and the light receiving element 40 are disposed so as not to overlap in the second direction Y. Thus, in the optical sensor 10, the light emitting element 30 and the light receiving element 40 are disposed farther from each other as compared to when the light emitting element 30 and the light receiving element 40 at least partially overlap in the second direction Y. Thus, the optical sensor 10 further reduces crosstalk.

(9) As shown in FIG. 9, the optical sensor 10 is configured to detect an object 200 that is present at a length Ln that is less than or equal to 6 mm from the upper surfaces of the first cover 50 and the second cover 60. In the optical sensor 10, a large portion of the light emitted from the light emitting element 30 is reflected by the object 200 and readily directed toward the light receiving element 40. The optical sensor 10 obtains a sufficient signal-to-noise (S/N) ratio for detecting the object 200 even if crosstalk is increased due to the absence of a light-blocking wall.

Second Embodiment

A second embodiment of an optical sensor 10A will now be described with reference to FIG. 10. In the second embodiment, same reference characters are given to those components that are the same as the corresponding components of the first embodiment. Such components will not be described in detail. The optical sensor 10A of the second embodiment differs from the optical sensor 10 of the first embodiment mainly in the structure of the gap GP.

Figure 10:
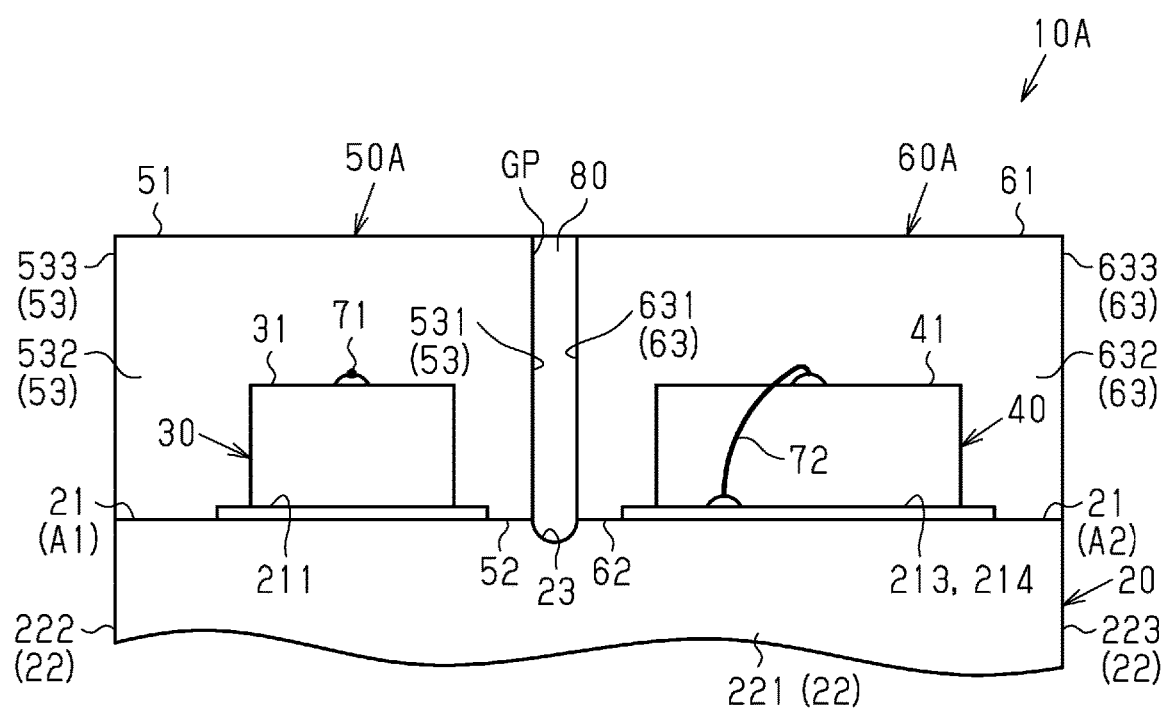
FIG. 10 is a side view showing a second embodiment of an optical sensor.
Figure 10:
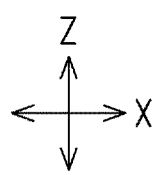

As shown in FIG. 10, the optical sensor 10A includes the substrate 20, the light emitting element 30, the light receiving element 40, a first cover 50A, a second cover 60A, the bonding wires 71 and 72, and a light-blocking ink 80.

The first cover 50A is substantially rectangular-box-shaped and includes the first upper surface 51, the first back surface 52, the first side surfaces 53. The second cover 60A is substantially rectangular-box-shaped and includes the second upper surface 61, the second back surface 62, and the second side surfaces 63.

The light-blocking ink 80 has a color that absorbs the wavelength of light emitted from the light emitting element 30. The gap GP between the first cover 50 and the second cover 60 is filled with the light-blocking ink 80. Preferably, the light-blocking ink 80 is solidified in the gap GP. However, the light-blocking ink 80 may be liquid or gelled as long as the light-blocking ink 80 remains in the gap GP. In the second embodiment, the gap GP is formed between the first cover 50 and the second cover 60. Although filled with the light-blocking ink 80, the gap GP is formed.

The second embodiment has the following advantages.

(10) The gap GP between the first cover 50A and the second cover 60A is filled with the light-blocking ink 80. Thus, the optical sensor 10A absorbs diffusion light emitted from the light emitting element 30 with the light-blocking ink 80. Thus, the optical sensor 10A further reduces crosstalk. The optical sensor 10A of the second embodiment has the advantages (1) and (4) to (9) of the first embodiment.

The second embodiment may be modified as follows.

Figure 11:
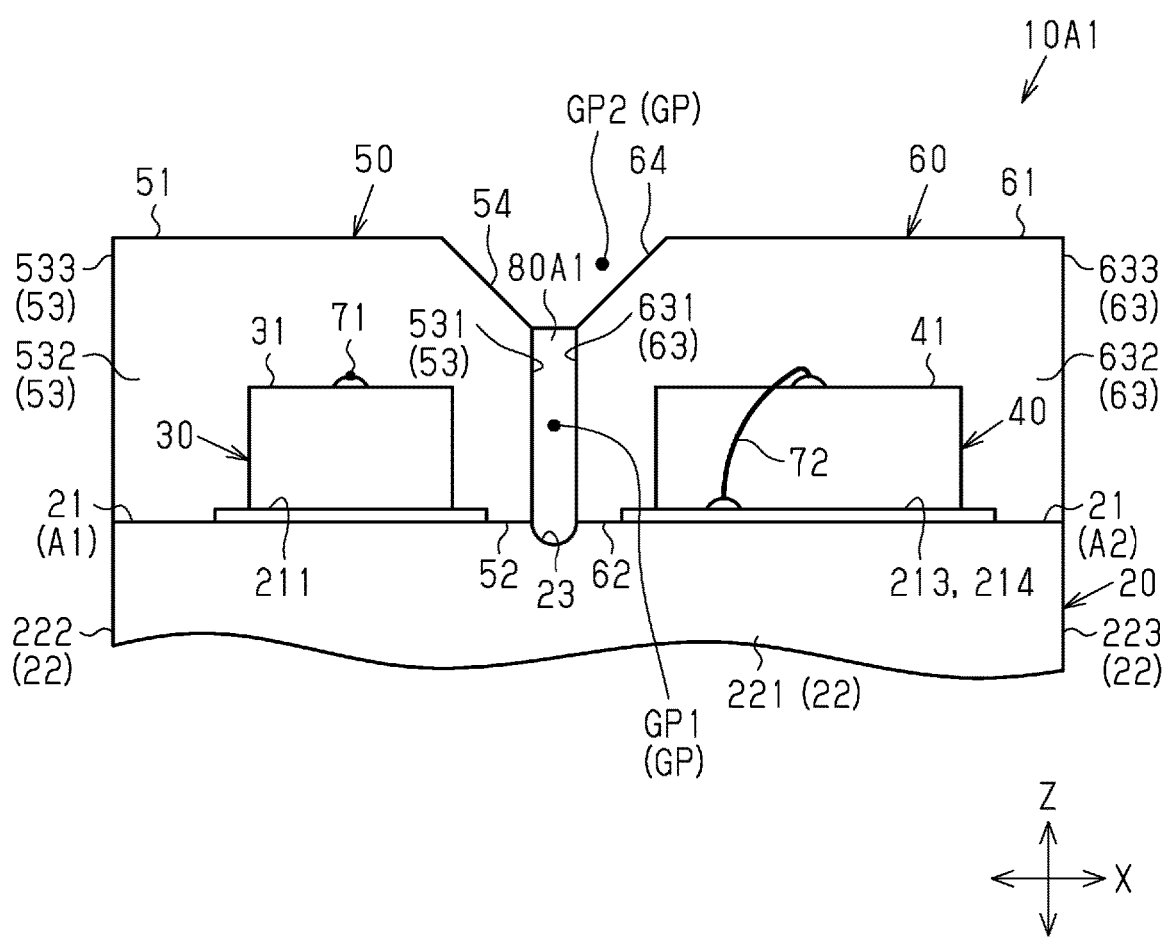
FIG. 11 is a side view showing a modified example of the optical sensor of the second embodiment.
Figure 12:
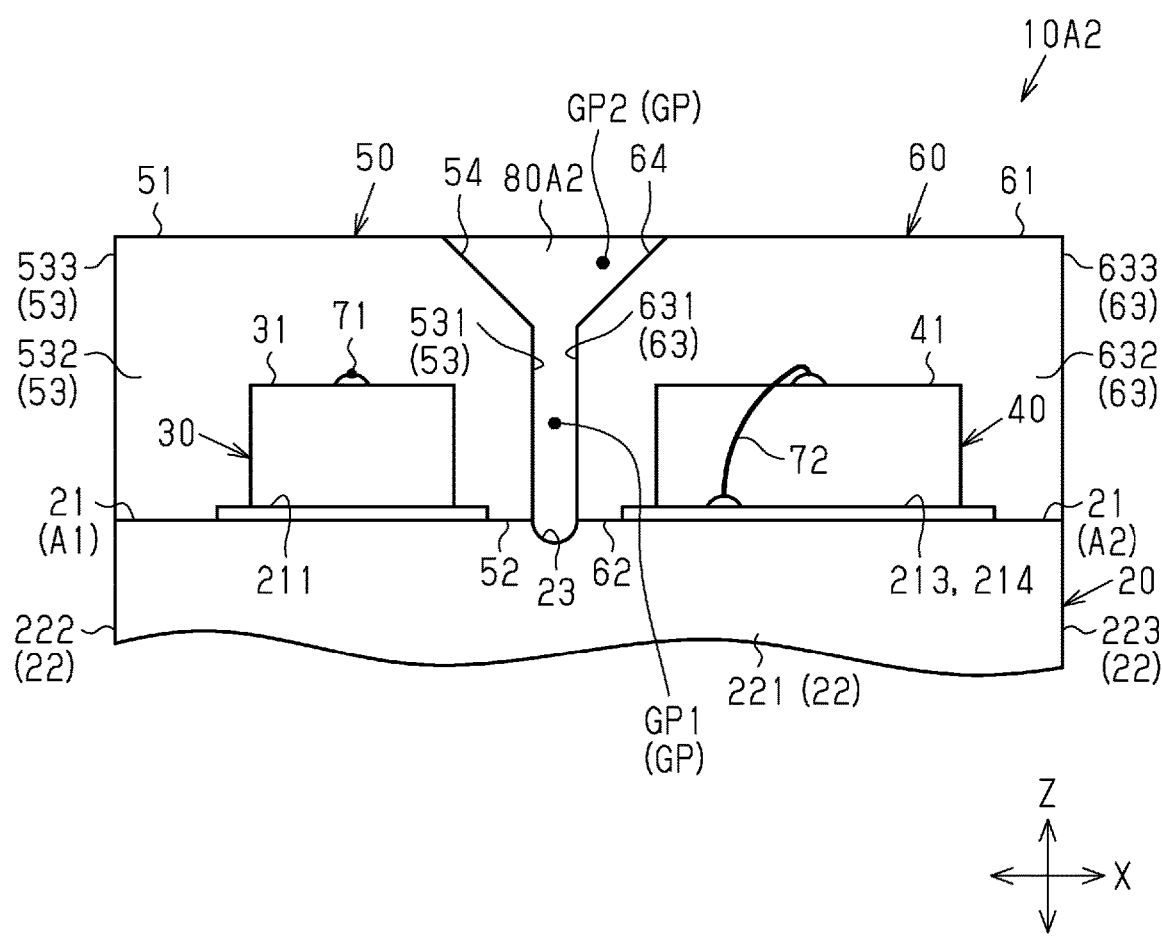
FIG. 12 is a side view showing a modified example of the optical sensor of the second embodiment.

As shown in FIGS. 11 and 12, the optical sensor 10A of the second embodiment may be changed to optical sensors 10A1 and 10A2, which include the first cover 50 including the first inclined surface 54 and the second cover 60 including the second inclined surface 64. In this case, as shown in FIG. 11, the gap GP includes a first part GP1 located between the first inner side surface 531 and the second inner side surface 631, and the optical sensor 10A1 may include a light-blocking ink 80A1 filling the first part GP1. As shown in FIG. 12, the optical sensor 10A2 may include a light-blocking ink 80A2 filling the entirety of the gap GP.

Third Embodiment

A third embodiment of an optical sensor 10B will now be described with reference to FIG. 13. In the third embodiment, same reference characters are given to those components that are the same as the corresponding components of the first embodiment. Such components will not be described in detail. The optical sensor 10B of the third embodiment differs from the optical sensor 10 of the first embodiment mainly in that the optical sensor 10B of the third embodiment includes a lens.

Figure 13:
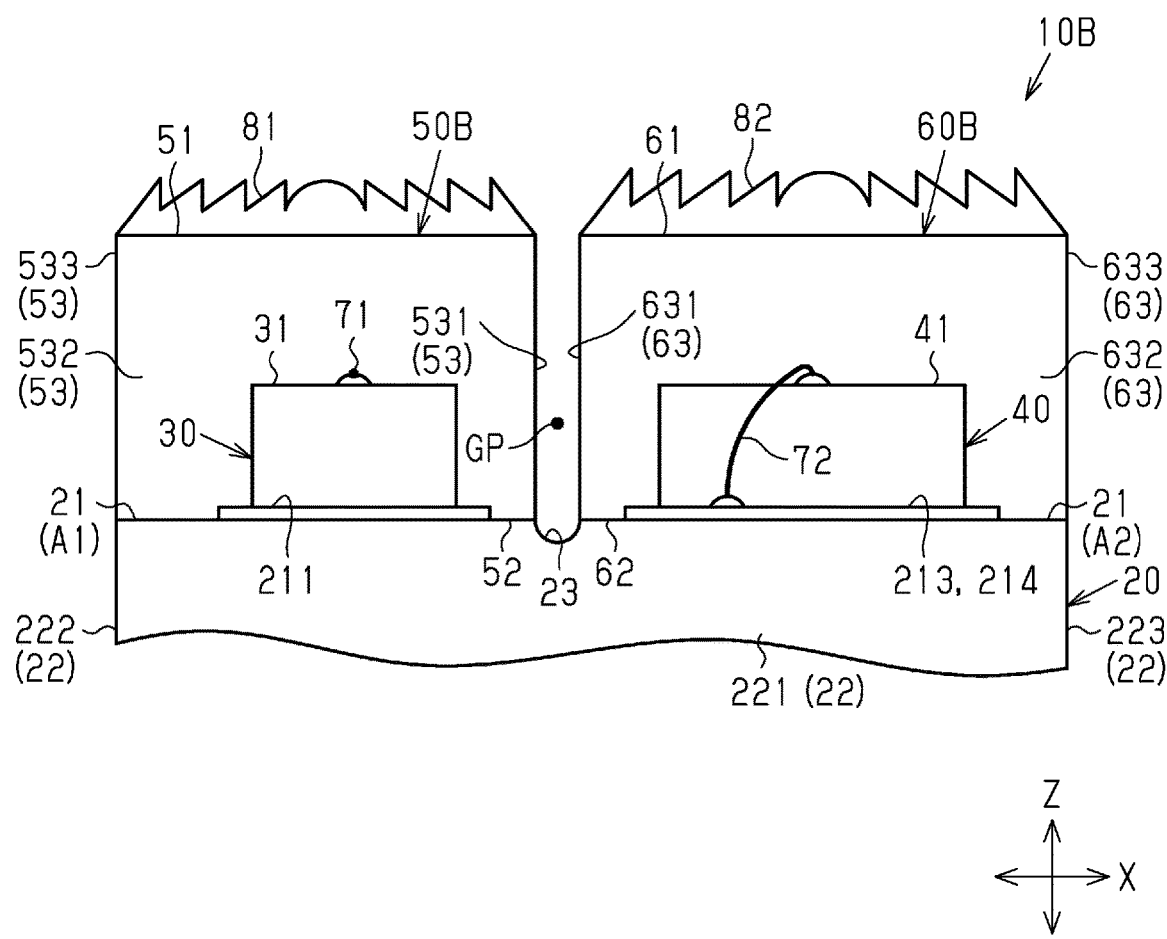
FIG. 13 is a side view showing a third embodiment of an optical sensor.

As shown in FIG. 13, the optical sensor 10B includes the substrate 20, the light emitting element 30, the light receiving element 40, a first cover 50B, a second cover 60B, the bonding wires 71 and 72, a first lens 81, and a second lens 82.

The first cover 50B is substantially rectangular-box-shaped. The first cover 50B includes the first upper surface 51, the first back surface 52, and the first side surfaces 53. The second cover 60B is substantially rectangular-box-shaped. The second cover 60B includes the second upper surface 61, the second back surface 62, and the second side surfaces 63.

The first lens 81 is formed on the first upper surface 51 of the first cover 50B. The first lens 81 collects light emitted from the light emitting element 30 or inclines the direction of light emitted from the light emitting element 30 so that when the light is reflected by an object, the light is readily directed toward the light receiving element 40. The second lens 82 is formed on the second upper surface 61 of the second cover 60B. The second lens 82 collects light that is going to enter the second cover 60 so that the light is directed toward the light receiving element 40.

The first lens 81 and the second lens 82 are each a Fresnel lens. In this case, the first lens 81 is an example of "the first Fresnel lens." The second lens 82 is an example of "the second Fresnel lens." The first lens 81 and the second lens 82 may be formed separately from the first cover 50B and the second cover 60B or may be formed integrally with the first cover 50B and the second cover 60B. When the first lens 81 and the second lens 82 are formed integrally with the first cover 50B and the second cover 60B, the first lens 81 and the second lens 82 may be, for example, formed simultaneously with the first cover 50B and the second cover 60B in the molding step S13.

The third embodiment has the following advantages.

(11) Since the optical sensor 10B includes the first lens 81 and the second lens 82, a large portion of the light emitted from the light emitting element 30 is reflected by the object 200, and the light reflected at the object 200 is readily directed toward the light receiving element 40. In addition, the first lens 81 and the second lens 82 are Fresnel lenses. This limits an increase in the dimension of the optical sensor 10B in the thickness-wise direction Z. The optical sensor 10B of the third embodiment has the advantages (1) and (4) to (9) of the first embodiment.

The third embodiment may be modified as follows.

The first lens 81 and the second lens 82 may each be a normal collecting lens.

The optical sensor 10B may include at least one of the first lens 81 and the second lens 82.

Fourth Embodiment

A fourth embodiment of an optical sensor 10C will now be described with reference to FIG. 14. In the fourth embodiment, same reference characters are given to those components that are the same as the corresponding components of the first embodiment. Such components will not be described in detail. The optical sensor 10C of the fourth embodiment differs from the optical sensor 10 of the first embodiment mainly in the structure of the light emitting element.

Figure 14:
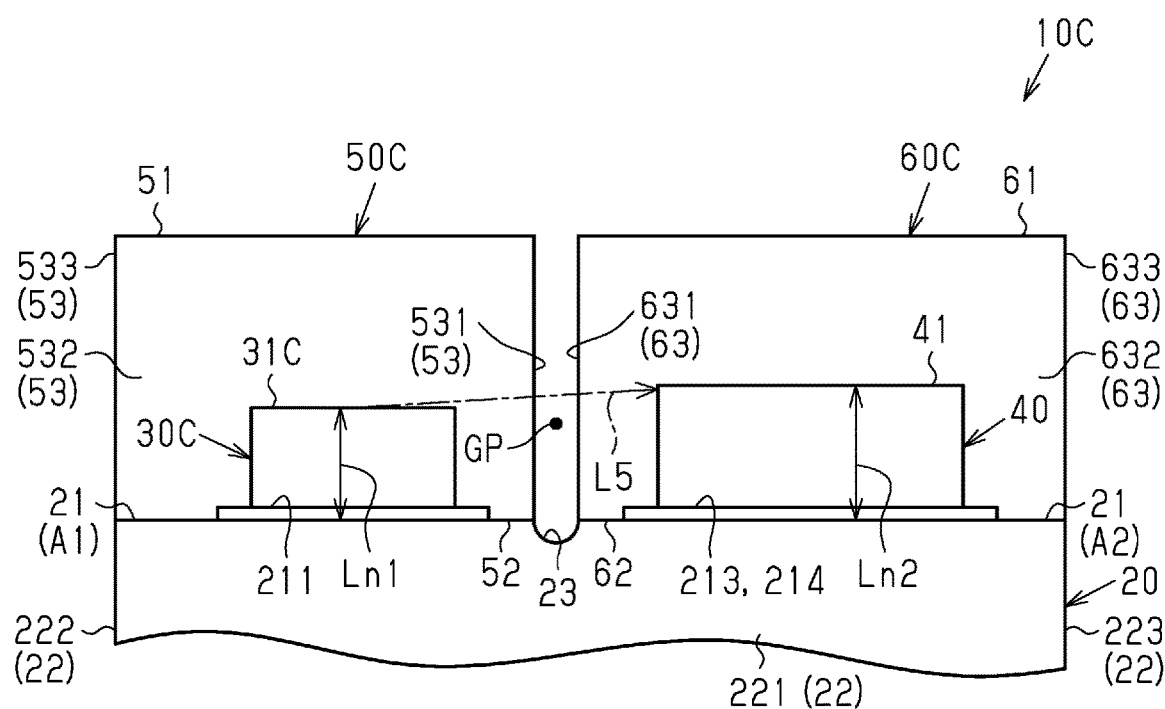
FIG. 14 is a side view showing a fourth embodiment of an optical sensor.

As shown in FIG. 14, the optical sensor 10C includes the substrate 20, a light emitting element 30C, the light receiving element 40, a first cover 50C, a second cover 60C, and the bonding wires 71 and 72. The bonding wires 71 and 72 are not shown in FIG. 14.

The light emitting element 30C is mounted on the first pad 211 and is connected to the second pad 212 by the bonding wire 71. The light emitting element 30C is smaller in the thickness-wise direction Z dimension than the light receiving element 40.

The first cover 50C is substantially rectangular-box-shaped. The first cover 50C includes the first upper surface 51, the first back surface 52, and the first side surfaces 53. The second cover 60C is substantially rectangular-boxshaped. The second cover 60C includes the second upper surface 61, the second back surface 62, and the second side surfaces 63.

As shown in FIG. 14, in the thickness-wise direction Z, a length Ln1 from the substrate main surface 21 to an upper surface 31C of the light emitting element 30C is less than a length Ln2 from the substrate main surface 21 to the upper surface 41 of the light receiving element 40. That is, in the thickness-wise direction Z, a length from the upper surface 31C of the light emitting element 30C to the first upper surface 51 of the first cover 50C is greater than a length from the upper surface 41 of the light receiving element 40 to the second upper surface 61 of the second cover 60C. Thus, the upper surface 31C of the light emitting element 30C and the upper surface 41 of the light receiving element 40 are located at different positions in the thickness-wise direction Z.

The fourth embodiment has the following advantages.

(12) In the optical sensor 10C, the upper surface 41 of the light receiving element 40 is located at a higher position than the upper surface 31C of the light emitting element 30C. Thus, as shown in FIG. 14, when diffusion light L5 is emitted from the light emitting element 30C in the first direction X or a direction that is slightly inclined from the first direction X, the diffusion light L5 is less likely to reach the upper surface 41 of the light receiving element 40. Thus, the optical sensor 10C further reduces crosstalk. The optical sensor 10C of the fourth embodiment has the advantages (1) and (4) to (9) of the first embodiment.

The fourth embodiment may be modified as follows.

Figure 15:
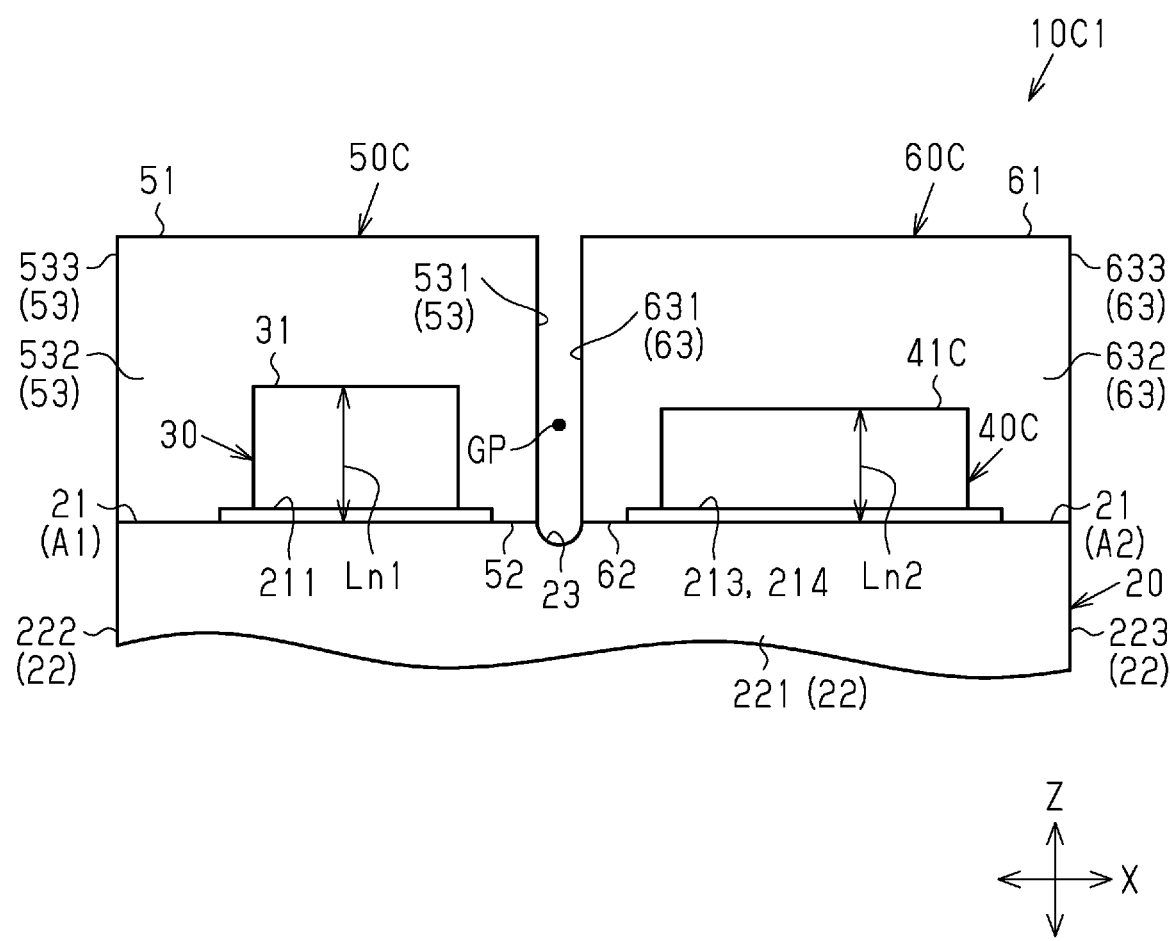
FIG. 15 is a side view showing a modified example of the optical sensor of the fourth embodiment.

As shown in FIG. 15, the optical sensor 10C may be changed to an optical sensor 10C1 that includes the light emitting element 30 and a light receiving element 40C. As shown in FIG. 15, in the thickness-wise direction Z, the length Ln1 from the substrate main surface 21 to the upper surface 31 of the light emitting element 30 is greater than the length Ln2 from the substrate main surface 21 to the upper surface 41C of the light receiving element 40C. That is, in the thickness-wise direction Z, the length from the upper surface 31 of the light emitting element 30 to the first upper surface 51 of the first cover 50C is less than the length from the upper surface 41C of the light receiving element 40C to the second upper surface 61 of the second cover 60C. The bonding wires 71 and 72 are not shown in FIG. 15.

As long as the length Ln1 differs from the length Ln2, the light emitting element 30C may be equal in the thickness-wise direction Z dimension to the light receiving element 40. In this case, a conductive intermediate portion may be disposed between the first pad 211 and the light emitting element 30C, or a conductive intermediate portion may be disposed between the fourth pad 214 and the light receiving element 40. In addition, the thickness of the first pad 211, on which the light emitting element 30C is mounted, may differ from the thickness of the fourth pad 214, on which the light receiving element 40 is mounted. In addition, the thickness of the substrate 20 may differ between a portion on which the first pad 211 is formed and a portion on which the fourth pad 214 is formed.

The above-described embodiments may be modified as follows. The embodiments and the following modified examples can be combined as long as the combined modified examples remain technically consistent with each other.

The optical sensors 10 and 10A to 10C may be configured to detect an object that is present at a length Ln that is more than 6 mm from the main surfaces of the first cover 50 and the second cover 60. In this case, it is preferred that the shape, size, or positional relationship of the components of the optical sensors 10 and 10A to 10C are changed so that the optical sensors 10 and 10A to 10C ensures the sufficient S/N ratio.

In plan view in the thickness-wise direction Z, the contour of the optical sensors 10 and 10A to 10C does not necessarily have to be square. The contour of the optical sensors 10 and 10A to 10C may be, for example, rectangular, polygonal, or circular.

Figure 16:
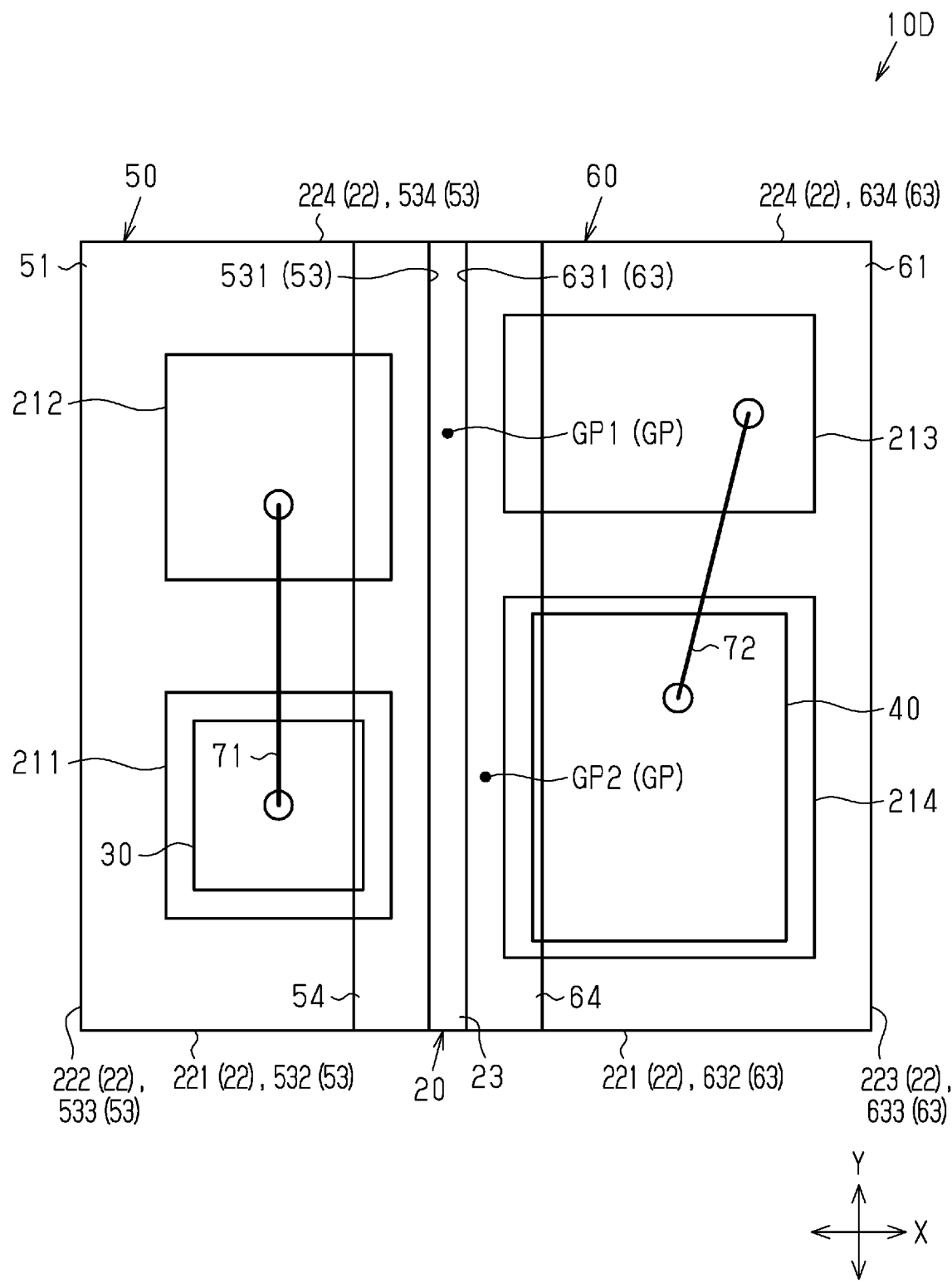
FIG. 16 is a plan view showing a modified example of an optical sensor.

As shown in FIG. 16, the optical sensor 10 may be changed to an optical sensor 10D. In the optical sensor 10D, the first pad 211 and the fourth pad 214 may be disposed adjacent to each other in the first direction X, and the second pad 212 and the third pad 213 may be disposed adjacent to each other in the first direction X. In other words, the first pad 211 and the fourth pad 214 may be disposed so as to at least partially overlap in the first direction X, and the second pad 212 and the third pad 213 may be disposed so as to at least partially overlap the first direction X. More specifically, the light emitting element 30 and the light receiving element 40 may be respectively disposed in regions defined by the groove 23.

Figure 17:
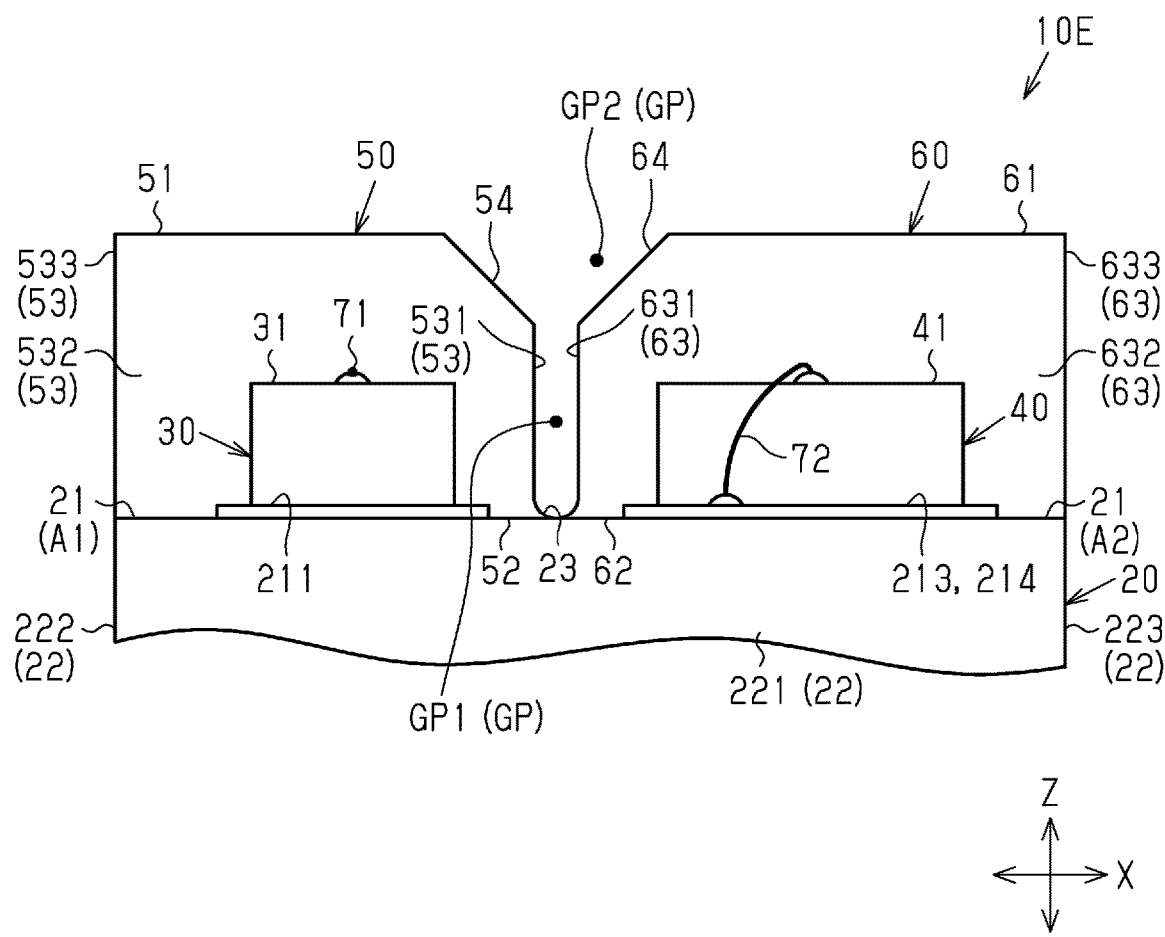
FIG. 17 is a side view showing a modified example of an optical sensor.

As shown in FIG. 17, the optical sensor 10 may be changed to an optical sensor 10E in which the groove 23 is not formed in the substrate 20. More specifically, when manufacturing the optical sensor 10E, the lower end of the dicing blade may be aligned with the substrate main surface 21 in the thickness-wise direction Z, and dicing may be performed along the straight line C1 shown in FIGS. 5 and 6.

Figure 18:
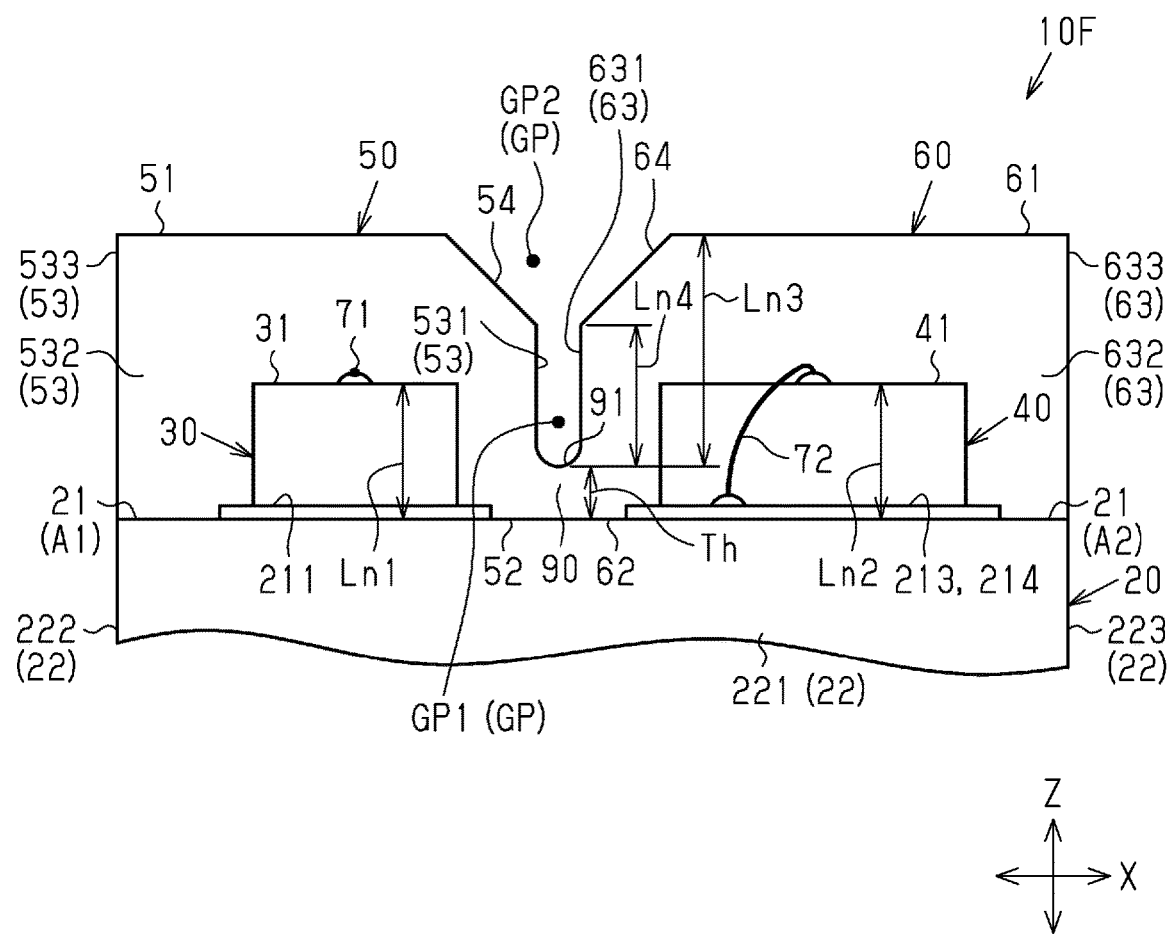
FIG. 18 is a side view showing a modified example of an optical sensor.

As shown in FIG. 18, the optical sensor 10 may be changed to an optical sensor 10F that includes a joint 90 disposed on the substrate main surface 21 to join the first cover 50 and the second cover 60.

The joint 90 has the form of a rod, the height-wise direction of which conforms to the second direction Y. The joint 90 joins the first cover 50 and the second cover 60 throughout in the second direction Y. That is, the joint 90 has the same length as the first cover 50 and the second cover 60 in the second direction Y In addition, the cross-sectional shape of the joint 90 is fixed in the second direction Y.

The joint 90 has a joint upper surface 91 that intersects the thickness-wise direction Z. The joint upper surface 91 is concaved toward the substrate main surface 21 and faces the gap GP. Thus, in the optical sensor 10F, the gap GP is defined by the first inner side surface 531 of the first cover 50, the second inner side surface 631 of the second cover 60, and the joint upper surface 91 of the joint 90. In other words, the gap GP is defined by the first cover 50, the second cover 60, and the joint 90. As described above, the first cover 50 and the second cover 60 may be separate from each other. The first cover 50 and the second cover 60 may be joined as long as the gap GP is formed.

When the joint 90 has a thickness Th that extends from the substrate main surface 21 to the joint upper surface 91 in the thickness-wise direction Z, it is preferred that the thickness Th of the joint 90 is less than the length Ln1 from the substrate main surface 21 to the upper surface 31 of the light emitting element 30 and less than the length from the substrate main surface 21 to the light emitting layer of the light emitting element 30. In addition, it is preferred that the thickness Th of the joint 90 is less than the length Ln2 from the substrate main surface 21 to the upper surface 41 of the light receiving element 40 and less than the length from the substrate main surface 21 to the light receiving layer of the light receiving element 40.

As described above, the joint upper surface 91 is curved. In this structure, the thickness Th of the joint 90 refers to the length from the substrate main surface 21 to a portion of the joint upper surface 91 that is located closest to the substrate main surface 21.

As shown in FIG. 18, the thickness Th of the joint 90 is less than a length Ln3 of the gap GP in the thickness-wise direction Z and is less than a length Ln4 of the first part GP1 in the thickness-wise direction Z. Thus, between the first cover 50 and the second cover 60, the gap GP occupies a greater region than the joint 90. However, there is no limit to such a structure. The thickness Th of the joint 90 may be set in any manner and may be, for example, greater than the length Ln4 of the first part GP1 in the thickness-wise direction Z.

The length Ln3 of the gap GP in the thickness-wise direction Z extends from the joint upper surface 91 (e.g., portion of the joint upper surface 91 located closest to the substrate main surface 21) to the upper ends of the first upper surface 51 and the second upper surface 61 in the thickness-wise direction Z. The length Ln4 of the first part GP1 in the thickness-wise direction Z extends from the joint upper surface 91 (e.g., portion of the joint upper surface 91 located closest to the substrate main surface 21) to the upper ends of the first inner side surface 531 and the second inner side surface 631 in the thickness-wise direction Z.

The joint 90 is formed, when manufacturing the optical sensor 10F, by performing dicing along the straight line shown in FIGS. 5 and 6 when the lower end of the dicing blade is located at a position higher than the substrate main surface 21 in the thickness-wise direction Z. Thus, the joint 90 is formed from the same resin material as the first cover 50 and the second cover 60, and the joint 90 is formed integrally with the first cover 50 and the second cover 60.

In the optical sensor 10F shown in FIG. 18, the first cover 50 and the second cover 60 are integrated by the joint 90, so that the strength of the optical sensor 10F is increased. In addition, in the optical sensor 10F, the thickness Th of the joint 90 is less than the length Ln1 from the substrate main surface 21 to the upper surface 31 of the light emitting element 30. This limits transmission of light emitted from the light emitting element 30 through the joint 90 toward the light receiving element 40. Thus, the optical sensor 10F reduces crosstalk caused by the joint 90.

The light emitting element 30 and the light receiving element 40 do not necessarily have to be rectangular-box-shaped. For example, the light emitting element 30 and the light receiving element 40 may be cuboid, cylindrical, or plate-shaped.

The light emitting element 30 may be a semiconductor laser element. The semiconductor laser element is, for example, a vertical cavity surface emitting LASER (VCSEL), which emits a laser beam in a perpendicular direction. This reduces diffusion of light emitted from the light emitting element 30.

The first inner side surface 531 of the first cover 50 and the second inner side surface 631 of the second cover 60 do not necessarily have to have a rough surface. Also, at least one of the first outer side surfaces 532, 533, and 534 of the first cover 50 does not necessarily have to have a rough surface. At least one of the second outer side surfaces 632, 633, and 634 of the second cover 60 does not necessarily have to have a rough surface.

The first inclined surface 54 of the first cover 50 and the second inclined surface 64 of the second cover 60 may have a rough surface. In this case, the first inclined surface 54 and the second inclined surface 64 may have a rough surface using molds having a rough surface. The first inclined surface 54 and the second inclined surface 64 may have a rough surface through a process performed after the resin is molded.

A mirror-like film or a light-blocking film may be arranged on the first inner side surface 531 of the first cover 50 to hinder diffusion light emitted from the light emitting element 30 from entering the inside of the second cover 60. Also, a mirror-like film or a light-blocking film may be arranged on the second inner side surface 631 of the second cover 60 to hinder diffusion light emitted from the light emitting element 30 from entering the inside of the second cover 60.

The gap GP between the first cover 50 and the second cover 60 may be formed using molds when molding the resin layer 120.

The first upper surface 51 of the first cover 50 and the second upper surface 61 of the second cover 60 may be located at different positions in the thickness-wise direction Z.

The intermediate body 100 may be diced without using a dicing blade. For example, dicing may be performed using a laser.

Clauses

The technical aspects will be described below based on the embodiments and the modified examples described above.

Clause 1

An optical sensor, including:
- a substrate including a substrate main surface intersecting a thickness-wise direction;
- a light emitting element disposed on the substrate main surface;
- a light receiving element disposed on the substrate main surface;
- a transparent first cover disposed on the substrate main surface to cover the light emitting element; and
- a transparent second cover disposed on the substrate main surface to cover the light receiving element;
- where the first cover and the second cover are spaced apart by a gap.

Clause 2

The optical sensor according to clause 1, where
- the first cover includes a first upper surface intersecting the thickness-wise direction and first side surfaces intersecting the first upper surface,
- the second cover includes a second upper surface intersecting the thickness-wise direction and second side surfaces intersecting the second upper surface,
- the first side surfaces include a first inner side surface that faces the gap and a first outer side surface that does not face the gap, and
- the second side surfaces include a second inner side surface that faces the gap and a second outer side surface that does not face the gap.

Clause 3

The optical sensor according to clause 2, where
- the first cover includes a corner at which the first upper surface and the first inner side surface are joined, and
- the corner of the first cover includes a first inclined surface intersecting the first upper surface and the first inner side surface.

Clause 4

The optical sensor according to clause 2 or 3, where
- the second cover includes a corner at which the second upper surface and the second inner side surface are joined, and the corner of the second cover includes a second inclined surface intersecting the second upper surface and the second inner side surface.

Clause 5

The optical sensor according to any one of clauses 2 to 4, where
the substrate includes a substrate side surface, and
the first outer side surface and the second outer side surface are flush with the substrate side surface in the thickness-wise direction.

Clause 6

The optical sensor according to any one of clauses 2 to 5, where the first inner side surface has a greater roughness than the first upper surface.

Clause 7

The optical sensor according to any one of clauses 2 to 6, where the second inner side surface has a greater roughness than the second upper surface.

Clause 8

The optical sensor according to any one of clauses 2 to 7, where the first outer side surface has a greater roughness than the first upper surface.

Clause 9

The optical sensor according to any one of clauses 2 to 8, where the second outer side surface has a greater roughness than the second upper surface.

Clause 10

The optical sensor according to any one of clauses 1 to 9, further including a light-blocking ink filling the gap.

Clause 11

The optical sensor according to any one of clauses 1 to 9, where the gap is filled with air.

Clause 12

The optical sensor according to any one of clauses 1 to 11, where an upper surface of the light emitting element and an upper surface of the light receiving element are located at different positions in the thickness-wise direction.

Clause 13

The optical sensor according to clause 12, where in the thickness-wise direction, a length from the substrate main surface to the upper surface of the light emitting element is less than a length from the substrate main surface to the upper surface of the light receiving element.

Clause 14

The optical sensor according to any one of clauses 2 to 13, where the first upper surface and the second upper surface are coplanar with each other.

Clause 15

The optical sensor according to any one of clauses 2 to 14, further including a first Fresnel lens disposed on the first upper surface.

Clause 16

The optical sensor according to any one of clauses 2 to 15, further including a second Fresnel lens disposed on the second upper surface.

Clause 17

The optical sensor according to any one of clauses 1 to 16, where
the first cover and the second cover oppose each other at opposite sides of the gap,
in plan view in the thickness-wise direction, the gap extends in a direction orthogonal to an opposing direction of the first cover and the second cover, and
in plan view in the thickness-wise direction, the light emitting element and the light receiving element are located at different positions in a direction in which the gap extends.

Clause 18

The optical sensor according to any one of clauses 1 to 17, where the substrate main surface includes a portion that faces the gap and a groove that is recessed from the portion in the thickness-wise direction.

Clause 19

The optical sensor according to clause 18, where
the substrate main surface includes a first region and a second region separated by the groove,
the light emitting element is disposed in the first region,
the light receiving element is disposed in the second region,
the first cover is disposed in the first region to cover the light emitting element,
the second cover is disposed in the second region to cover the light receiving element, and
in plan view in the thickness-wise direction, the light receiving element is greater in size than the light emitting element, and the second region is greater in size than the first region.

Clause 20

The optical sensor according to clause 19, where
the first cover and the second cover oppose each other at opposite sides of the gap,
in plan view in the thickness-wise direction, the groove extends in a direction orthogonal to an opposing direction of the first cover and the second cover,
each of the first region and the second region is rectangular and has a short-side direction conforming to a width-wise direction of the groove and a long-side direction conforming to a direction in which the groove extends,
the first region is greater in dimension in the short-side direction than the second region, and
the first region is equal in dimension in the long-side direction to the second region.

Clause 21

The optical sensor according to clause 19 or 20, where
the first cover and the second cover oppose each other at opposite sides of the gap,
in plan view in the thickness-wise direction, the groove extends in a direction orthogonal to an opposing direction of the first cover and the second cover,
the substrate includes a first pad and a second pad in the first region and a third pad and a fourth pad in the second region,
the first pad and the second pad align in a direction in which the groove extends,
the third pad and the fourth pad align in the direction in which the groove extends,
the light emitting element is mounted on the first pad and electrically connected to the second pad, and
the light receiving element is mounted on the fourth pad and electrically connected to the third pad.

Clause 22

The optical sensor according to clause 21, where
the first pad is disposed so as to at least partially overlap the third pad and so as not to overlap the fourth pad in a width-wise direction of the groove, and
the second pad is disposed so as to at least partially overlap the fourth pad and so as not to overlap the third pad in the width-wise direction of the groove.

Clause 23

The optical sensor according to any one of clauses 1 to 17, further including a joint disposed on the substrate main surface to join the first cover and the second cover, where the gap is defined by the first cover, the second cover, and the joint.

Clause 24

The optical sensor according to clause 23, where
the joint includes a joint upper surface facing the gap,
in the thickness-wise direction, the joint has a thickness that extends from the substrate main surface to the joint upper surface,
the thickness of the joint is less than a length from the substrate main surface to an upper surface of the light emitting element.

Clause 25

The optical sensor according to clause 23 or 24, where
the joint includes a joint upper surface facing the gap,
the joint has a thickness that extends from the substrate main surface to the joint upper surface in the thickness-wise direction,
the thickness of the joint is less than a length of the gap in the thickness-wise direction.

Clause 26

The optical sensor according to any one of clauses 1 to 25, where
the first cover and the second cover oppose each other at opposite sides of the gap,
in plan view in the thickness-wise direction, the substrate is rectangular and includes a first substrate side surface, a second substrate side surface, a third substrate side surface, and a fourth substrate side surface,
the first substrate side surface and the fourth substrate side surface extend in an opposing direction of the first cover and the second cover,
the second substrate side surface and the third substrate side surface extend in a direction orthogonal to the opposing direction and join the first substrate side surface and the fourth substrate side surface,
the light emitting element is disposed closer to the first substrate side surface than to the fourth substrate side surface, and
the light receiving element is disposed closer to the fourth substrate side surface than to the first substrate side surface.

Clause 27

The optical sensor according to any one of clauses 1 to 26, where the light emitting element is a semiconductor laser element that emits a laser beam in a perpendicular direction.

Clause 28

The optical sensor according to any one of clauses 1 to 27, where in plan view in the thickness-wise direction, the optical sensor is square.

Clause 29

The optical sensor according to clause 28, where in plan view in the thickness-wise direction, each side of the optical sensor has a length that is greater than or equal to 0.5 mm and less than or equal to 1.0 mm.

Clause 30

The optical sensor according to any one of clauses 1 to 29, where the optical sensor is configured to detect an object that is present in a range of 6 mm or less from the first cover and the second cover.

Clause 31

A method for manufacturing an optical sensor, the optical sensor including a substrate including a substrate main surface intersecting a thickness-wise direction, a light emitting element disposed on the substrate main surface, a light receiving element disposed on the substrate main surface, a transparent first cover disposed on the substrate main surface to cover the light emitting element, and a transparent second cover disposed on the substrate main surface to cover the light receiving element, the method including:
a molding step of molding a resin layer that covers the substrate main surface, the light emitting element, and the light receiving element; and
a cutting step of cutting a portion of the resin layer located between a portion covering the light emitting element and a portion covering the light receiving element to form a gap between the first cover and the second cover.

REFERENCE SIGNS LIST 10, 10A, 10A1, 10A2, 10B, 10C, 10C1, 10D, 10E, 10F) optical sensor; 10X) optical sensor of comparative example; 20) substrate; 21) substrate main surface; 211) first pad; 212) second pad; 213) third pad; 214) fourth pad; 22) substrate side surface; 221) first substrate side surface; 222) second substrate side surface; 223) third substrate side surface; 224) fourth substrate side surface; 23) groove; 30, 30C) light emitting element; 31, 31C) upper surface; 40, 40C) light receiving element; 41, 41C) upper surface; 50, 50A, 50B, 50C) first cover; 50X) cover of comparative example; 51) first upper surface; 51X) upper surface; 2) first back surface; 53) first side surface; 531) first inner side surface; 532) first outer side surface; 533) first outer side surface; 534) first outer side surface; 54) first inclined surface; 60, 60A, 60B, 60C) second cover; 61) second upper surface; 62) second back surface; 63) second side surface; 631) second inner side surface; 632) second outer side surface; 633) second outer side surface; 634) second outer side surface; 64) second inclined surface; 71, 72) bonding wire; 80, 80A1, 80A2) light-blocking ink; 81) first lens (example of first Fresnel lens); 82) second lens (example of second Fresnel lens); 90) joint; 91) joint upper surface; 100) intermediate body; 110) large substrate; 120) resin layer; 121) front surface; 122) recess; 123) inclined surface; 200) object; A1) first region; A2) second region; GP) gap; GP1) first part; GP2) second part; L1 to L5) diffusion light; X) first direction; Y) second direction; Z) thickness-wise direction

The invention claimed is:

1. An optical sensor, comprising:
a substrate including a substrate main surface intersecting a thickness-wise direction;
a light emitting element disposed on the substrate main surface;
a light receiving element disposed on the substrate main surface;
a transparent first cover disposed on the substrate main surface to cover the light emitting element; and
a transparent second cover disposed on the substrate main surface to cover the light receiving element; wherein
the first cover and the second cover are spaced apart by a gap,
the first cover includes a first upper surface intersecting the thickness-wise direction and first side surfaces intersecting the first upper surface,
the second cover includes a second upper surface intersecting the thickness-wise direction and second side surfaces intersecting the second upper surface,
the first side surfaces include a first inner side surface that faces the gap and a first outer side surface that does not face the gap,
the second side surfaces include a second inner side surface that faces the gap and a second outer side surface that does not face the gap, and the first inner side surface has a greater roughness than the first upper surface.

2. The optical sensor according to claim 1, wherein
the first cover includes a corner at which the first upper surface and the first inner side surface are joined, and
the corner of the first cover includes a first inclined surface intersecting the first upper surface and the first inner side surface.

3. The optical sensor according to claim 1, wherein
the second cover includes a corner at which the second upper surface and the second inner side surface are joined, and
the corner of the second cover includes a second inclined surface intersecting the second upper surface and the second inner side surface.

4. The optical sensor according to claim 1, wherein
the substrate includes a substrate side surface, and
the first outer side surface and the second outer side surface are flush with the substrate side surface in the thickness-wise direction.

5. The optical sensor according to claim 1, wherein the second outer side surface has a greater roughness than the second upper surface.

6. The optical sensor according to claim 1, further comprising a light-blocking ink filling the gap.

7. The optical sensor according to claim 1, wherein the gap is filled with air.

8. The optical sensor according to claim 1, wherein an upper surface of the light emitting element and an upper surface of the light receiving element are located at different positions in the thickness-wise direction.

9. The optical sensor according to claim 8, wherein in the thickness-wise direction, a length from the substrate main surface to the upper surface of the light emitting element is less than a length from the substrate main surface to the upper surface of the light receiving element.

10. The optical sensor according to claim 1, wherein the first upper surface and the second upper surface are coplanar with each other.

11. The optical sensor according to claim 1, further comprising a first Fresnel lens disposed on the first upper surface.

12. The optical sensor according to claim 1, further comprising a second Fresnel lens disposed on the second upper surface.

13. The optical sensor according to claim 1, wherein
the first cover and the second cover oppose each other at opposite sides of the gap,
in plan view in the thickness-wise direction, the gap extends in a direction orthogonal to an opposing direction of the first cover and the second cover, and
in plan view in the thickness-wise direction, the light emitting element and the light receiving element are located at different positions in a direction in which the gap extends.

14. The optical sensor according to claim 1, wherein the substrate main surface includes a portion that faces the gap and a groove that is recessed from the portion in the thickness-wise direction.

15. The optical sensor according to claim 14, wherein
the substrate main surface includes a first region and a second region separated by the groove,
the light emitting element is disposed in the first region,
the light receiving element is disposed in the second region,
the first cover is disposed in the first region to cover the light emitting element, the second cover is disposed in the second region to cover the light receiving element, and
in plan view in the thickness-wise direction, the light receiving element is greater in size than the light emitting element, and the second region is greater in size than the first region.

16. An optical sensor, comprising:
a substrate including a substrate main surface intersecting a thickness-wise direction;
a light emitting element disposed on the substrate main surface;
a light receiving element disposed on the substrate main surface;
a transparent first cover disposed on the substrate main surface to cover the light emitting element; and
a transparent second cover disposed on the substrate main surface to cover the light receiving element; wherein
the first cover and the second cover are spaced apart by a gap,
the first cover includes a first upper surface intersecting the thickness-wise direction and first side surfaces intersecting the first upper surface,
the second cover includes a second upper surface intersecting the thickness-wise direction and second side surfaces intersecting the second upper surface,
the first side surfaces include a first inner side surface that faces the gap and a first outer side surface that does not face the gap,
the second side surfaces include a second inner side surface that faces the gap and a second outer side surface that does not face the gap, and
the second inner side surface has a greater roughness than the second upper surface.

17. An optical sensor, comprising:
a substrate including a substrate main surface intersecting a thickness-wise direction;
a light emitting element disposed on the substrate main surface;
a light receiving element disposed on the substrate main surface;
a transparent first cover disposed on the substrate main surface to cover the light emitting element; and
a transparent second cover disposed on the substrate main surface to cover the light receiving element; wherein
the first cover and the second cover are spaced apart by a gap,
the first cover includes a first upper surface intersecting the thickness-wise direction and first side surfaces intersecting the first upper surface,
the second cover includes a second upper surface intersecting the thickness-wise direction and second side surfaces intersecting the second upper surface,
the first side surfaces include a first inner side surface that faces the gap and a first outer side surface that does not face the gap,
the second side surfaces include a second inner side surface that faces the gap and a second outer side surface that does not face the gap, and
the first outer side surface has a greater roughness than the first upper surface.

* * * * *